(12) United States Patent
Eaglesham et al.

(10) Patent No.: US 10,236,493 B2
(45) Date of Patent: *Mar. 19, 2019

(54) MULTI-ELECTRODE ELECTROCHEMICAL CELL AND METHOD OF MAKING THE SAME

(71) Applicant: Pellion Technologies, Inc., Cambridge, MA (US)

(72) Inventors: David J. Eaglesham, Lexington, MA (US); Robert Ellis Doe, Medfield, MA (US); Christopher C. Fischer, Somerville, MA (US); Craig M. Downie, Waltham, MA (US); Matthew J. Trahan, Franklin, MA (US)

(73) Assignee: PELLION TECHNOLOGIES, INC., Woburn, MA (US)

( * ) Notice: Subject to any disclaimer, the term of this patent is extended or adjusted under 35 U.S.C. 154(b) by 619 days.

This patent is subject to a terminal disclaimer.

(21) Appl. No.: 14/790,649

(22) Filed: Jul. 2, 2015

(65) Prior Publication Data

US 2016/0126532 A1    May 5, 2016

Related U.S. Application Data

(60) Provisional application No. 62/020,337, filed on Jul. 2, 2014.

(51) Int. Cl.
*H01M 2/34* (2006.01)
*H01M 10/48* (2006.01)
(Continued)

(52) U.S. Cl.
CPC .............. *H01M 2/34* (2013.01); *G01R 31/36* (2013.01); *H01M 4/381* (2013.01); *H01M 4/40* (2013.01);
(Continued)

(58) Field of Classification Search
None
See application file for complete search history.

(56) References Cited

U.S. PATENT DOCUMENTS

| 4,349,614 A | 9/1982 | Werth |
| 5,585,206 A | 12/1996 | Morris |

(Continued)

FOREIGN PATENT DOCUMENTS

| EP | 0060642 A1 | 9/1982 |
| EP | 2367228 A1 | 9/2011 |

(Continued)

OTHER PUBLICATIONS

International Search Report in related PCT/US2015/039008, dated Jan. 28, 2016.

(Continued)

*Primary Examiner* — Tracy M Dove
(74) *Attorney, Agent, or Firm* — Joseph B. Milstein PC

(57) ABSTRACT

A multi-electrode device that includes an anode electrode, a cathode electrode, and a gate electrode situated between the anode and cathode, and having an electrolyte. The multi-electrode device can be a secondary (rechargeable) electrochemical cell. The gate electrode is permeable to at least one mobile species which is redox-active at at least one of the anode and cathode. The gate electrode has a resistance that is lower than that of a conductive non-uniform morphological feature that could be grown on the anode. The gate electrode provides the ability to avoid, recognize, and remove the presence of such non-uniform morphological features, and provides an electrical electrode that can be used to remove such non-uniform morphological features.

22 Claims, 32 Drawing Sheets

(51) Int. Cl.
*H01M 4/38* (2006.01)
*H01M 4/40* (2006.01)
*H01M 4/42* (2006.01)
*H01M 4/48* (2010.01)
*H01M 4/58* (2010.01)
*H01M 10/054* (2010.01)
*H01M 10/058* (2010.01)
*G01R 31/36* (2019.01)
*H01M 10/04* (2006.01)
*H01M 10/42* (2006.01)

(52) U.S. Cl.
CPC ............ *H01M 4/42* (2013.01); *H01M 4/48* (2013.01); *H01M 4/58* (2013.01); *H01M 4/5815* (2013.01); *H01M 10/0445* (2013.01); *H01M 10/054* (2013.01); *H01M 10/058* (2013.01); *H01M 10/4235* (2013.01); *H01M 10/4242* (2013.01); *H01M 10/48* (2013.01); *H01M 10/4257* (2013.01); *H01M 2200/00* (2013.01); *H01M 2220/10* (2013.01); *H01M 2220/20* (2013.01); *H01M 2220/30* (2013.01)

(56) References Cited

U.S. PATENT DOCUMENTS

| | | |
|---|---|---|
| 5,688,614 A | 11/1997 | Li et al. |
| 6,002,239 A | 12/1999 | Maloziel |
| 6,335,115 B1 | 1/2002 | Meissner |
| 6,383,675 B1 | 5/2002 | Zhong |
| 6,869,727 B2 | 3/2005 | Slezak |
| 7,846,571 B2 | 12/2010 | Christensen et al. |
| 8,017,260 B2 | 9/2011 | Kaneta et al. |
| 8,119,269 B2 | 2/2012 | Ramasubramanian et al. |
| 2005/0158613 A1 | 7/2005 | Liu et al. |
| 2007/0020496 A1 | 1/2007 | Pelton et al. |
| 2007/0141432 A1 | 6/2007 | Wang et al. |
| 2008/0100264 A1 | 5/2008 | Kolosnitsyn et al. |
| 2011/0217588 A1 | 9/2011 | Roh et al. |
| 2011/0248719 A1 | 10/2011 | Aoki |
| 2011/0250478 A1 | 10/2011 | Timmons et al. |
| 2012/0242144 A1 | 9/2012 | Chorian et al. |
| 2013/0009604 A1 | 1/2013 | Bhardwaj et al. |
| 2013/0224632 A1 | 8/2013 | Roumi |
| 2014/0329120 A1 | 11/2014 | Cui |
| 2015/0171398 A1 | 6/2015 | Roumi |
| 2015/0180000 A1 | 6/2015 | Roumi |

FOREIGN PATENT DOCUMENTS

| | | |
|---|---|---|
| JP | 2011-124104 A | 6/2011 |
| KR | 1013754220000 | 8/2012 |
| WO | 2011070712 A1 | 6/2011 |
| WO | 2014179725 A1 | 11/2014 |
| WO | 2014204479 A1 | 12/2014 |

OTHER PUBLICATIONS

Written Opinion in related PCT/US2015/039008, dated Jan. 28, 2016.

Long, Jeffrey W., et al., Three-Dimensional Battery Architectures, Chem. Rev. vol. 104, pp. 4463-4492, Aug. 19, 2004.

Rosso, Michel, et al., Dendrite short-circuit and fuse effect on Li/polymer/Li cells, Electrochimica Acta vol. 51, pp. 5334-5340, Mar. 10, 2006.

Choi, Sung Min et al., Cycling characteristics of lithium metal batteries assembled with a surface modified lithium electrode, Journal of Power Sources vol. 244, pp. 363-368, Jan. 5, 2013.

Adam Heller, The G. S. Yuasa-Boeing 787 Li-ion Battery: Test It at a Low Temperature and Keep It Warm in Flight, The Electrochemical Society Interface Summer 2013, p. 35, Published online Mar. 25, 2013.

(Prior Art as FIG.1 from Roh et al.)

(Prior Art as FIG.2 from Roh et al.)

(Prior Art as Fig. 1 from Meissner)

(Prior Art as FIG. 1 from Zhong)

(Prior Art as FIG. 9 from Slezak)

(Prior Art as FIG. 1, FIG. 2 and FIG. 3 from Morris)

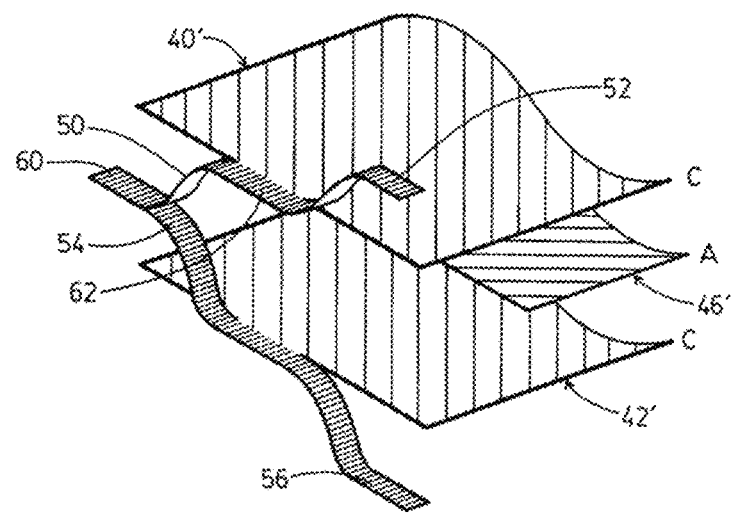
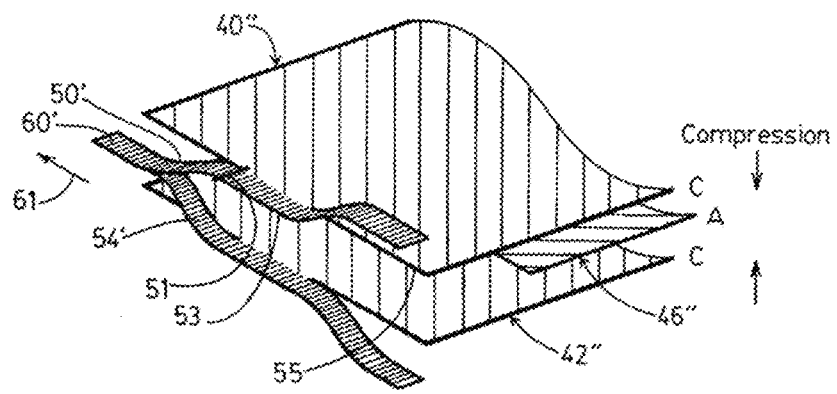
Fig. 10
(Prior Art as FIG. 4A and FIG. 4B from Morris)

FIG. 12 (PRIOR ART as FIG. 6 from Christiansen)

(Prior Art as FIG. 7 from Kaneta et al.)

(Prior Art as FIG. 2 from Ramasubramanian et al.)

(Noguchi Fig. 8)

PRIOR ART (Cui FIG. 1a, 1b)

Fig. 25A                    Fig. 25B

MULTI-ELECTRODE ELECTROCHEMICAL CELL AND METHOD OF MAKING THE SAME

CROSS-REFERENCE TO RELATED APPLICATIONS

This application claims priority to and the benefit of co-pending U.S. provisional patent application Ser. No. 62/020,337, filed Jul. 2, 2014, which application is incorporated herein by reference in its entirety.

FIELD OF THE INVENTION

The invention relates to electrochemical cells in general and particularly to an electrochemical cell having more than two electrodes.

BACKGROUND

High capacity and reliability secondary (rechargeable) electrochemical cells and batteries are pivotal to improving mobile electronics, and are becoming more important in transportation and energy storage applications as batteries take on more prominent roles in these realms. Key chemistries in current commercial secondary cells, and the batteries constructed from those cells, include Li-ion, lead-acid (Pb-acid), nickel-metal-hydride (NIMH), and Zn-air.

Mg based secondary cells, whether based on metal or other electrode types, are now emerging as a potential improvement upon existing cell types for increased gravimetric and volumetric energy-density. Mg cells are expected to approach 500 Wh/Kg versus Li-ion's 250 Wh/Kg. Similarly; Mg cells are expected to approach 1600 Wh/L versus Li-ion's 800 Wh/L. Moreover, magnesium is the eighth most abundant element on Earth, and is much less rare than lithium. At the same time, magnesium is easier and safer to handle and can be incorporated in cells using the same or similar manufacturing techniques as cells using lithium. An important class of problems in the development of all of these cells arises from inability to control the ongoing evolution of cell morphology and potential-distribution that occurs during charge-discharge cycles wherein electrochemically active species are redistributed throughout an electrochemical cell. In particular, anodes such as those employed in Mg, Pb, Li, and Zn-air cells can suffer from the development of non-uniform morphology during electrochemical cycling of the anode. Non-uniform morphologies variously referred to as dendrites, whiskers, asperities, and the like, can create immediately destructive and hazardous internal short circuits if they grow large enough to create an electrical connection between the electrodes of an electrochemical cell. This problem particularly plagues the cycle life of all metal-anode cells and, despite the potential benefits of metal electrodes, has led the industry to employ non-metal electrodes in many commonly used cell types to minimize these problems, even though non-metal electrodes do not completely eliminate these problems. Non-uniform morphologies also cause longer term capacity fade through two related processes: First, the creation of a high-surface-area interface between an electrode and electrolyte that forms massive amounts of decomposition products commonly-termed "solid electrolyte interphase" through parasitic, or unintended, reactions with the electrolyte. In the case of Li metal anodes, these side reactions of the electrolyte form "mossy Li deposits." Second, the stripping cycle of the cell can leave finely divided, but electrically-isolated metal (known as the "dead lithium" problem in Li-metal technology development) distributed between the electrodes. Moreover, imbalances in the amount of active electrode material of the positive electrode relative to the amount of active electrode material in the negative electrode can also increase accumulations of undesirable metal or metal compounds. Consequently, rechargeable batteries can suffer such unfortunate events as thermal runaway, cell rupture, catching fire or even exploding if subjected to the wrong electrical or thermal conditions.

One approach, which is the dominant approach today, is to simply avoid the use of metallic electrodes altogether, by constructing electrodes operating as intercalation hosts, or alloying, conversion, and disproportionation reactions. This technique aims to eliminate a direct metal surface at the cost of energy density of the cell. Nevertheless, the use of intercalation hosts, or alloying, conversion, and disproportionation reaction materials results in a cell that may still ultimately deposit metal on an electrode surface under certain conditions of operation. Moreover, avoiding the use of metal anodes would very likely prohibit the implementation of Mg cells, now widely recognized as one of the most promising next-generation chemistries for moving beyond Li-ion batteries.

Another approach to preventing degradation of metallic electrodes has been to provide an ionically conductive, but electrically insulating coating such as a ceramic or polymer on the surface of the electrode that contacts the electrolyte. However, this approach will fail if even small imperfections in the coating exist, and the electrolyte can make direct contact with the electrode. Moreover, although there have been claims in the literature that certain coatings prevent surface plating, laboratory measurements presented below indicate that these claims are not reproducible, and surface plating that would lead to non-uniform morphological features occurs on the coating, obviating its utility.

The vast majority of electrochemical cells have only two electrodes: a cathode and an anode. However, a third passive "reference" electrode is well-known in the field and is widely used in both lab cells and commercial cells for monitoring purposes. These reference electrodes are managed so as to have no effect on the operation of the cell, and play no role in maintaining the performance of the cell. Since its role is to monitor cell electrochemistry, rather than to drive significant current, this reference electrode is generally much smaller than the two "working electrodes," covering only a small portion of the active area of the cell. To limit any possible influence or interference with the working electrodes reference electrodes frequently lie outside the stack of cathode/separator/anode while maintaining ionic contact with the electrolyte. Similarly, in order to accurately measure cell performance without interacting with the working electrodes, the currents passed through a reference electrode typically lie in the range of 1-1000 ppm of the current through working electrodes.

In addition to the use of reference electrodes, there have been several proposals for third electrodes in the cell, several of which are discussed below.

Known in the prior art is Werth, U.S. Pat. No. 4,349,614, issued Sep. 14, 1982 (also published as European Patent Application Publication No. EP0060642 on Sep. 22, 1982), which is said to disclose an auxiliary electrode of platinum or palladium that is immersed in the electrolyte of a lead-acid battery and connected to the negative plate of the battery so that, when the battery is employed in float service, hydrogen evolves on the auxiliary electrode whereby the parasitic current equivalent to the hydrogen evolution increases the float current to the positive plate of the battery.

Also known in the prior art is Morris, U.S. Pat. No. 5,585,206, issued Dec. 17, 1996, which is said to disclose electrode sections, such as anode and cathode sections, of a battery cell that include current collectors with exposed portions. The exposed portions contain slits which form tabs. These tabs can be spot welded together to form connections between the electrode sections.

Also known in the prior art is Li et al., U.S. Pat. No. 5,688,614, issued Nov. 18, 1997, which is said to disclose an electrochemical cell provided with first and second electrodes, and a solid polymer electrolyte disposed therebetween. The electrodes may either be of the same or different materials and may be fabricated from ruthenium, iridium, cobalt, tungsten, vanadium, iron, molybdenum, hafnium, nickel, silver, zinc, and combinations thereof. The solid polymer electrolyte is in intimate contact with both the anode and the cathode, and is made from a polymeric support structure having dispersed therein an electrolyte active species. The polymer support structure is preferably a multi-layered support structure in which at least a first layer is fabricated of a polybenzimidazole, and at least a second layer is fabricated of, for example, poly vinyl alcohol.

Also known in the prior art is Maloizel, U.S. Pat. No. 6,002,239, issued Dec. 14, 1999, which is said to disclose a cell charging voltage adapter circuit, and a battery including such a circuit external to the cell and cell stack assembly, wherein the charging circuit includes terminals of resistor between one of the connecting terminals and one of the output terminals and a comparator between the connecting terminals and adapted to control the variable resistor in accordance with the results of comparing the voltage between the connecting terminals and a nominal voltage.

Also known in the prior art is Meissner, U.S. Pat. No. 6,335,115, issued Jan. 1, 2002, which is said to disclose secondary lithium-ion cells which include at least one lithium-intercalating, carbon-containing negative electrode, a nonaqueous lithium ion-conducting electrolyte and at least one lithium-intercalating positive electrode including a lithium-containing chalcogen compound of a transition metal, the electrodes being separated from one another by separators. A lithium-containing auxiliary electrode is disposed in the cell to compensate for the irreversible capacity loss in the secondary lithium-ion cell.

Also known in the prior art is Zhong, U.S. Pat. No. 6,383,675, issued May 7, 2002, which is said to disclose a third electrode for use in a metal-air tricell comprising a support structure coated with a layer of a lanthanum nickel compound and at least one metal mixture, wherein the mixture is adhered to the support structure without the use of an adhesive. In another embodiment, the Zhong invention relates to a metal-air tricell comprising: an air electrode; a metal electrode; and a third electrode, wherein the third electrode comprises a support structure coated with a mixture of a lanthanum nickel compound and at least one metal, wherein the mixture is adhered to the support structure without the use of an adhesive. Additionally, the Zhong invention also relates to a method of forming a third electrode for use in a metal-air tricell comprising the steps of: (A) applying a mixture of a lanthanum nickel compound and at least one metal oxide to a support structure, thereby yielding a coated support structure; and (B) heating the coated support structure in order to reduce the metal oxide present in the lanthanum nickel compound/metal oxide mixture to its corresponding metal and to adhere the mixture to the support structure, thereby yielding a third electrode wherein the third electrode is free of an adhesive.

Also known in the prior art is Slezak, U.S. Pat. No. 6,869,727 issued Mar. 22, 2005, which is said to disclose an electrochemical battery cell having a high electrode interfacial surface area to improve high rate discharge capacity, where the shapes of the electrodes facilitate the manufacture of cells of high quality and reliability at high speeds suitable for large scale production. The interfacial surfaces of the solid body electrodes have radially extending lobes that increase the interfacial surface area. The lobes do not have sharp corners, and the concave areas formed between the lobes are wide open, to facilitate assembly of the separator and insertion of the other electrode into the concave areas without leaving voids between the separator and either electrode.

Also known in the prior art is Wang et al., U.S. Patent Application Publication No. 2007/0141432 A1, published Jun. 21, 2007, which is said to disclose a third electrode frame structure for use in a fuel cell or battery is provided. The third electrode frame structure may include a first electrode, a separator positioned on an outer perimeter of the first electrode, and a frame third electrode coupled to the separator. The separator may be positioned in a same plane between the first electrode and the third frame electrode.

Also known in the prior art is Christensen et al., U.S. Pat. No. 7,846,571, issued Dec. 7, 2010, which is said to disclose a lithium-ion battery cell which includes at least two working electrodes, each including an active material, an inert material, an electrolyte and a current collector, a first separator region arranged between the at least two working electrodes to separate the at least two working electrodes so that none of the working electrodes are electronically connected within the cell, an auxiliary electrode including a lithium reservoir, and a second separator region arranged between the auxiliary electrode and the at least two working electrodes to separate the auxiliary electrode from the working electrodes so that none of the working electrodes is electronically connected to the auxiliary electrode within the cell.

Also known in the prior art is Roh et al., U.S. Patent Application Publication No. 2011/0217588 A1, published Sep. 8, 2011, which is said to disclose a secondary battery which includes an electrode assembly comprising inner stacked electrodes and at least one outermost electrode positioned on at least one end of the inner stacked electrodes; and a case configured to house the electrode assembly. The at least one outermost electrode comprises an inactive material.

Also known in the prior art are a range of techniques for the use of an additional electrode to monitor cell chemistry. For example, Kaneta et al., U.S. Pat. No. 8,017,260, issued Sep. 13, 2011, is said to disclose a secondary battery in which temperature rise (heat generation) can be measured accurately at the time of quick charge/discharge, and a battery which can be configured readily using the secondary batteries while realizing low resistance. Separately from the positive and negative electrode terminals of a flat laminate film secondary battery, a third terminal is fixed perpendicularly thereto. The third terminal is connected with the electrode current collecting parts of a power generating element body constituting the secondary battery (1) and imparted with a potential equal to that of any one of the positive and negative electrode terminals. Inner temperature of the secondary battery is determined by measuring the temperature of the third terminal and a cell balancer circuit, or the like, is connected with the third terminal. The battery is configured by connecting the positive and negative electrode terminals directly in series.

Also known in the prior art is Ramasubramanian et al., U.S. Pat. No. 8,119,269, issued Feb. 21, 2012, which is said to disclose three-dimensional secondary battery cells comprising an electrolyte, a cathode, an anode, and an auxiliary electrode. The cathode, the anode, and the auxiliary electrode have a surface in contact with the electrolyte. The anode and the cathode are electrolytically coupled. The auxiliary electrode is electrolytically coupled and electrically coupled to at least one of the anode or the cathode. According to Ramasubramanian, electrically coupled means directly or indirectly connected in series by wires, traces or other connecting elements. The average distance between the surface of the auxiliary electrode and the surface of the coupled cathode or the coupled anode is between about 1 micron and about 10,000 microns. According to Ramasubramanian, the average distance means the average of the shortest path for ion transfer from every point on the coupled cathode or anode to the auxiliary electrode.

Also known in the prior art is Roumi, U.S. Patent Application Publication No. 2013/0224632 A1, published Aug. 29, 2013, which is said to disclose separator systems for electrochemical systems providing electronic, mechanical and chemical properties useful for a variety of applications including electrochemical storage and conversion. Embodiments provide structural, physical and electrostatic attributes useful for managing and controlling dendrite formation and for improving the cycle life and rate capability of electrochemical cells including silicon anode based batteries, air cathode based batteries, redox flow batteries, solid electrolyte based systems, fuel cells, flow batteries and semisolid batteries. Disclosed separators include multilayer, porous geometries supporting excellent ion transport properties, providing a barrier to prevent dendrite initiated mechanical failure, shorting or thermal runaway, or providing improved electrode conductivity and improved electric field uniformity. Disclosed separators include composite solid electrolytes with supporting mesh or fiber systems providing solid electrolyte hardness and safety with supporting mesh or fiber toughness and long life required for thin solid electrolytes without fabrication pinholes or operationally created cracks.

Also known in the prior art is Noguchi, Korean Patent No. 1013754220000, issued Mar. 17, 2014, which claimed priority to Japanese Patent Application 2009/281122 through WO 2011/070712 A1, published on Jun. 16, 2011, which is said to disclose the following: Provided is a lithium-ion battery wherein internal short-circuits that are caused by inclusion of metallic foreign matter can be detected early with high sensitivity. Also provided is a method for producing the same. The lithium-ion battery, which is provided with a positive electrode (16), a negative electrode (15), and an electrolyte, is further provided with an electric insulating layer (3) which is between the positive electrode and the negative electrode and comprises an electro conductive layer (4). By applying a voltage between the positive electrode (16) and the electroconductive layer (4), and measuring a current and a potential difference between the positive electrode (16) and the electro conductive layer (4), the possibility of the occurrence of internal short-circuits in the lithium-ion battery can be detected early with high sensitivity since there is an earlier occurrence of a short-circuit between the positive electrode and the electroconductive layer than between the positive electrode and the negative electrode.

Also known in the prior art is Cui, et al., U.S. Patent Application Publication No. 2014/0329120 A1, published Nov. 6, 2014 (simultaneously with Cui, et al., WO 2014/179725 A1), which is said to disclose a battery that includes: 1) an anode; 2) a cathode; 3) a separator disposed between the anode and the cathode, wherein the separator includes at least one functional layer; and 4) a sensor connected to the at least one functional layer to monitor an internal state of the battery.

There is abundant recognition that the presence and the formation of non-uniform morphological features is one of the most serious problems in electrochemical cells, and particularly so in the compact batteries employed in devices such as mobile phones, grid-communication systems, distributed telemetry systems, tablet computers, laptop computers, backup-power systems, cameras, aerial drones, alarm systems, fire detection systems, personal fitness sensors, power tools, electronic instruments, musical instruments, aircraft, automobiles, satellites and many other devices with similar requirements. Unfortunately, there has been very little progress in managing non-uniform morphological features for such cells. Indeed, the primary driver for the adoption of intercalated electrodes is to suppress the formation of non-uniform morphological features, but the adoption of such electrodes comes at the cost of energy density.

In addition, it is well known in the field that non-uniform morphological features are a common failure mode even in cells utilizing intercalated electrodes. Specifically it is known that in Li-ion cells where the anode incorporates Li at a potential close to the Li metal-plating potential (including but not limited to anodes comprising graphite, silicon, or tin), non-uniform morphological features may form due to low-temperature cycling, excessive charging (either to too high potentials, or too rapidly) or a combination (see Adam Heller, The G. S. Yuasa-Boeing 787 Li-ion Battery: Test It at a Low Temperature and Keep It Warm in Flight, The Electrochemical Society Interface Summer 2013, page 35, Published online Mar. 25, 2013, for example). Thus the risk of non-uniform morphological features is known to be a prime limiter of performance in normal intercalation-anode Li-ion batteries, specifically limiting charging profiles, charging rates, and temperature windows for operation.

A more general description of some of the deleterious effects of deposition of metal or other material is that an anode electrode or cathode electrode can become distorted or changed in shape from the dimensions of the electrode that were originally provided in the battery, e.g., asperities or other changes resulting in non-uniform morphological features or dimensions of the electrode, can negatively impact the good operation of the battery.

There is a need for systems and methods that can control the undesired evolution of morphological changes of electrodes.

SUMMARY OF THE INVENTION

Taken as a whole, the present disclosure opens the door for a long sought need, and commercially valuable goal: the ability to use either non-metallic or metallic working electrodes (or electrodes that operate close to the metallic potential) in compact secondary cells that continue to operate for extended numbers of charge-discharge cycles without being damaged by the evolution of non-uniform electrode morphology.

According to one aspect, the invention features a device comprising: a cathode electrode having a cathode electrical terminal, the cathode electrode in electrochemical communication with an electrolyte; an anode electrode having a anode electrical terminal, the anode electrode in electrochemical communication with the electrolyte; at least one gate electrode having a gate electrode electrical terminal, the at least one gate electrode in electrochemical communication with the electrolyte and permeable to at least one mobile species which is redox-active at at least one of the anode electrode and the cathode electrode, the at least one gate electrode situated between the cathode electrode and the anode electrode; and a control circuit configured to actively control an operating parameter of the device.

In one embodiment, the control circuit is configured to set a voltage of the at least one gate electrode relative to at least one of the anode electrode and the cathode electrode at a predetermined voltage value.

In another embodiment, the predetermined voltage value is sufficient to strip plated metal derived from the at least one mobile species.

In yet another embodiment, the predetermined voltage value is a formation potential of a non-uniform morphological feature.

In still another embodiment, the control circuit is configured to maintain a current between the at least one gate electrode and the anode electrode to be less than a threshold current.

In another embodiment, the control circuit is configured to control a flow of current through the device based on one of a voltage, an impedance and a current measured between the at least one gate electrode and at least one of the anode electrode and the cathode electrode.

In a further embodiment, the device is a secondary electrochemical cell.

In yet a further embodiment, the at least one gate electrode has a planar geometry defined by a thickness dimension and a two dimensional area perpendicular to the thickness dimension.

In an additional embodiment, the at least one gate electrode is ionically conductive along the thickness dimension and is electrically conductive perpendicular to the thickness dimension.

In one more embodiment, an impedance measured at a frequency less than 1 Hertz between any two points on a two dimensional area perpendicular to the thickness dimension of the at least one gate electrode is less than 1 MegaOhm.

In still a further embodiment, the anode electrode is a metal anode.

In one embodiment, the metal anode is Magnesium or an alloy containing Magnesium.

In another embodiment, the metal anode comprises a metal or an alloy containing a metal selected from the group of metals consisting of Zinc, Calcium, Aluminum, Lithium, Sodium, and Lead.

In yet another embodiment, the anode electrode is an anode electrode selected from the group consisting of a conversion anode, an intercalation host, an alloying reaction anode and a disproportionation reaction anode.

In still another embodiment, the redox-active ionic species is lithium and the anode comprises a material selected from the group of materials consisting of crystalline carbon, amorphous carbon, Na, K, Rb, Cs, Be, Mg, Ca, Sr, Al, Si, Ge, Sb, Pb, In, Zn, Sn, and binary Me-X compounds wherein X is selected from the group consisting of sulfur, phosphorous, nitrogen and oxygen, and Me includes a metal selected from the group consisting of Mg, Ca, Sr, Ti, Zr, V, Nb, Ta, Cr, Mo, W, Mn, Fe, Co, Ni, Cu, Ag, Zn, Cd, B, Al, Si, Sn, Ge, Sb, Bi and a combination thereof.

In a further embodiment, the anode electrode is configured to operate under plating conditions based on the temperature, voltage, charging-rate or combination thereof.

In yet a further embodiment, the at least one gate electrode comprises a selected one of an electronically conducting material as freestanding form and an electronically conductive film deposited upon an insulating substrate having porosity and tortuosity, and connected to external circuit through a dedicated tab.

In an additional embodiment, the at least one gate electrode has porosity sufficient to maximize the efficiency of the permeability to the at least one mobile species.

In one more embodiment, the at least one gate electrode has porosity having sufficient tortuosity to minimize the probability that a non-uniform morphological feature projecting through the at least one gate electrode fails to make electrical contact to the at least one gate electrode.

According to another aspect, the invention relates to a secondary electrochemical cell having a cathode electrode having a cathode electrical terminal, the cathode electrode in electrochemical communication with a electrolyte and an anode electrode having a anode electrical terminal, the anode electrode in electrochemical communication with the electrolyte; wherein the improvement comprises: at least one gate electrode having a gate electrode electrical terminal, the at least one gate electrode in electrochemical communication with the electrolyte and permeable to at least one mobile species in the electrolyte which is redox-active at at least one of the anode electrode and the cathode electrode, the at least one gate electrode situated between the cathode electrode and the anode electrode; and a control circuit configured to actively control an operating parameter of the device.

According to still another aspect, the invention relates to a method of making an electrochemical device. The method comprises the steps of: providing a cathode electrode having a cathode electrical terminal; providing an anode electrode having a anode electrical terminal; providing an electrolyte in in electrochemical communication with the cathode electrode and the anode electrode; providing at least one gate electrode having a gate electrode electrical terminal, the at least one gate electrode in electrochemical communication with the electrolyte and permeable to at least one mobile species in the anode electrode which is redox-active at at least one of the anode electrode and the cathode electrode, the at least one gate electrode situated between the cathode electrode and the anode electrode; and providing a control circuit configured to actively control an operating parameter of the device.

According to a further aspect, the invention relates to a method of operating an electrochemical device. The method comprises the steps of: providing a cathode electrode having a cathode electrical terminal; providing an anode electrode having a anode electrical terminal; providing an electrolyte in in electrochemical communication with the cathode electrode and the anode electrode; providing at least one gate electrode having a gate electrode electrical terminal, the at least one gate electrode in electrochemical communication with the electrolyte and permeable to at least one mobile species in the anode electrode which is redox-active at at least one of the anode electrode and the cathode electrode, the at least one gate electrode situated between the cathode electrode and the anode electrode; providing a control circuit configured to actively control an operating parameter of the device; and operating the electrochemical device such that the control circuit maintains the operating parameter of the electrochemical device in a condition of normal cell health.

According to one aspect, the invention features a device comprising: a cathode electrode having a cathode electrical terminal, the cathode electrode in communication with an electrolyte; an anode electrode having a anode electrical terminal, the anode electrode in communication with the electrolyte; at least one gate electrode having a gate electrode electrical terminal, the gate electrode in communication with the electrolyte and permeable to at least one mobile species which is redox-active at least one of the anode and the cathode, the gate electrode situated between the cathode electrode and the anode electrode; and a stripping circuit configured to apply a current to the gate electrode sufficient to strip a non-uniform morphological feature that is electrically connected to either of the cathode electrode and the anode electrode.

In one embodiment, the gate electrode has a planar geometry defined by a thickness dimension and a two dimensional area perpendicular to the thickness dimension.

In another embodiment, the anode is a metal anode.

In yet another embodiment, the metal anode is magnesium or an alloy containing magnesium.

In still another embodiment, the metal anode comprises a metal or an alloy containing a metal selected from the group of metals consisting of zinc, calcium, aluminum, lithium, sodium, and lead.

In a further embodiment, the anode has a reaction voltage that lies within 0.1V to 1.2V of the non-uniform morphological feature formation potential.

In yet a further embodiment, the anode is a conversion anode.

In an additional embodiment, the anode is an intercalation host.

In one more embodiment, the anode is an alloying reaction anode.

In still a further embodiment, the anode is a disproportionation reaction anode.

In one embodiment, the redox-active ionic species is lithium and the anode comprises a material selected from the group of materials consisting of crystalline carbon, amorphous carbon, Na, K, Rb, Cs, Be, Mg, Ca, Sr, Al, Si, Ge, Sb, Pb, In, Zn, Sn, and binary Me-X compounds wherein X is selected from the group consisting of sulfur, phosphorous, nitrogen and oxygen, and Me includes a metal selected from the group consisting of Mg, Ca, Sr, Ti, Zr, V, Nb, Ta, Cr, Mo, W, Mn, Fe, Co, Ni, Cu, Ag, Zn, Cd, B, Al, Si, Sn, Ge, Sb, Bi and a combination thereof.

In another embodiment, the anode is operating under plating conditions based on the temperature, voltage, charging-rate or combination thereof.

In yet another embodiment, the gate electrode is ionically conductive along the thickness dimension and is electrically conductive perpendicular to the thickness dimension.

In still another embodiment, the gate electrode comprises an electronically conducting material as freestanding form, or film deposited upon an insulating substrate with sufficient porosity and tortuosity, and connected to external circuit through a dedicated tab.

In a further embodiment, the gate electrode has porosity sufficient to maximize the efficiency of the permeability to at least one mobile species.

In yet a further embodiment, the gate electrode has porosity having sufficient tortuosity to minimize the probability that a non-uniform morphological feature projecting through the gate electrode fails to make electrical contact to the gate.

In an additional embodiment, the device further comprises a response circuit configured to recognize a condition of an electrical short circuit between the gate electrode and a selected one of the anode electrode and the cathode electrode; and a stripping circuit configured to apply a stripping current to the anode electrode sufficient to strip a non-uniform morphological feature to eliminate the electrical short circuit, the response circuit and the stripping circuit configured to operate cooperatively.

In one more embodiment, the response circuit and the stripping circuit configured to operate cooperatively.

In still a further embodiment, the stripping circuit is configured to provide a stripping current in the range of 0.01% to 10% of the current at the metal anode electrode and the cathode electrode when the device is operated in charge or in discharge.

In one embodiment, the gate electrode is configured to operate with net-neutral current flow with respect to the current at the metal anode electrode and the cathode electrode when the device is operated in charge or in discharge.

In another embodiment, the stripping current is applied between anode and cathode.

In yet another embodiment, the device further comprises a cell charging circuit.

In still another embodiment, the cell charging circuit is configured to switch from charge to discharge in the event that a non-uniform morphological feature creates a low-impedance pathway between the gate electrode and either of the cathode electrode and the anode electrode.

In a further embodiment, the discharge event has a current and duration controlled based upon the voltage sensed at the gate electrode.

In yet a further embodiment, the device comprises multiple gate electrodes

According to another aspect, the invention relates to a multi-electrode electrochemical cell having more than two substantially parallel electrodes in which at least one interior electrode comprises an ionically permeable current-collector.

According to yet another aspect, the invention relates to an electrochemical cell having a cathode electrode having a cathode electrical terminal, the cathode electrode in communication with a electrolyte and an anode electrode having a anode electrical terminal, the anode electrode in communication with the electrolyte wherein the improvement comprises at least one gate electrode having a gate electrode electrical terminal, the gate electrode in communication with the electrolyte and permeable to at least one mobile species which is redox-active at at least one of the anode and the cathode, the gate electrode situated between the cathode electrode and the anode electrode.

According to still another aspect, the invention relates to an electrochemical cell, comprising a cathode electrode having a cathode electrical terminal, the cathode electrode in communication with an electrolyte; an anode electrode having a anode electrical terminal, the anode electrode in communication with the electrolyte; and a structure having a third electrical terminal, the structure in communication with the electrolyte and permeable to at least one mobile species which is redox-active at at least one of the anode and the cathode, the structure configured to recognize the presence of an electrically conductive non-uniform morphological feature that grows from either the cathode electrode and the anode electrode such that the non-uniform morphological feature if permitted to grow without control would provide an electrical short circuit between the cathode electrode and the anode electrode, and configured to receive a current at the third electrical terminal sufficient to strip a non-uniform morphological feature that is electrically connected to either of the cathode electrode and the anode electrode.

According to a further aspect, the invention relates to an electrochemical cell having a cathode electrode having a cathode electrical terminal, the cathode electrode in communication with an electrolyte and an anode electrode having a anode electrical terminal, the anode electrode in communication with the electrolyte; wherein the improvement comprises a structure having a third electrical terminal, the structure in communication with the electrolyte and permeable to at least one mobile species which is redox-active at at least one of the anode and the cathode, the structure configured to recognize the presence of an electrically conductive non-uniform morphological feature that grows from either the cathode electrode and the anode electrode such that the non-uniform morphological feature if permitted to grow without control would provide an electrical short circuit between the cathode electrode and the anode electrode, and configured to receive a current at the third electrical terminal sufficient to strip a non-uniform morphological feature that is electrically connected to either of the cathode electrode and the anode electrode.

According to another aspect, the invention relates to an electrochemical cell, comprising: a cathode electrode having an electrical terminal, the cathode electrode having a cathode shape, a cathode length, a cathode width and a cathode thickness, the cathode electrode in communication with an electrolyte; an anode electrode having an electrical terminal, the anode electrode having an anode shape, an anode length, an anode width and an anode thickness, the anode electrode in communication with the electrolyte; at least one gate electrode having a gate electrode electrical terminal, the gate electrode in communication with the electrolyte and permeable to at least one mobile species which is redox-active at least one of the anode and the cathode, the gate electrode situated between the cathode electrode and the anode electrode; and a control circuit in electrical communication with at least one of the cathode electrode and the anode electrode and in electrical communication with the electrolyte, the control circuit configured to recognize and response the presence of an electrically conductive non-uniform morphological feature that grows from either the cathode electrode and the anode electrode such that the non-uniform morphological feature if permitted to grow without control would provide an electrical short circuit between the cathode electrode and the anode electrode, and configured to provide a current to the gate electrode electrical terminal sufficient to strip a non-uniform morphological feature that is electrically connected to either of the cathode electrode and the anode electrode.

In one embodiment, the control circuit is configured to apply an electrical signal that limits the growth of the non-uniform morphological feature so as to prevent an electrical short circuit between the cathode electrode and the anode electrode.

In another embodiment, the control circuit is configured to apply an electrical signal that reverses the growth of the non-uniform morphological feature.

In yet another embodiment, the control circuit is configured to limit the growth of the non-uniform morphological feature so as to prevent a change in at least one of the cathode shape, the cathode length, the cathode width and the cathode thickness.

In still another embodiment, the control circuit is configured to limit the growth of the non-uniform morphological feature so as to prevent a change in at least one of the anode shape, the anode length, the anode width and the anode thickness.

According to another aspect, the invention relates to a method of operating an electrochemical cell having an anode, a cathode, a gate electrode, an electrolyte and a control circuit in electrical communication with at least one of the cathode electrode and the anode electrode and in electrical communication with gate electrode, comprising the steps of: measuring a selected one of a current and a voltage between at least two respective pairs of the cathode electrode, the anode electrode and the gate electrode to derive a value; determining an operating state of the electrochemical cell from the value; and if the operating state of the electrochemical cell is normal, waiting for a predefined length of time, and then repeating the measuring step, and if the operating state of the electrochemical cell indicates that a short circuit is expected to occur, applying an electrical signal configured to dissolve a growing non-uniform morphological feature, and then repeating the measuring step.

In yet a further embodiment, the stripping circuit and the operating conditions of the cell are configured to provide a voltage at the anode in the range of 0 V to 1.2V with respect to the metal-plating potential of the redox-active species of the cell. In some embodiments, the voltage in the range of 0V to 1.2V of the metal-plating potential is a voltage of 0.1V, 0.2V, 0.3V, 0.4V, 0.5V, 0.6V, 0.7V, 0.8V, 0.9V, 1.0V or 1.1V from the metal-plating potential.

In a further embodiment, the device further comprises a response circuit configured to recognize a condition in which the gate electrode can no longer be maintained at its target potential; and a charging circuit configured to trigger a discharge current between the cathode electrode and the anode electrode when such a condition is sensed. Following a prescribed discharging event to strip the short, charging may resume. The discharge event triggered when such a condition is recognized may be optimized for both rate and duration depending on the cell performance and history and on the voltage measured at the gate electrode during discharge.

In yet another embodiment the device may further comprise a plurality of gate electrodes configured to respond to the progressive growth of non-uniform morphological features across the cell. In such an embodiment, the plurality of gate electrodes may have a plurality of external gate electrode terminals or alternatively may be connected to a single external gate electrode terminal.

In still another embodiment, the gate electrode may be configured so as to protect against non-uniform morphological features only in specific regions of the cell. In some embodiments, the regions are the tabs or the electrode perimeter regions.

According to one aspect, the invention features an electrochemical cell having one or more gate electrodes (that is, a third or subsequent electrode) situated between a cathode and anode. The present disclosure addresses the previously described fundamental problems through the addition of one or more added "control" or "gate" electrodes interposed between the two working electrodes. The electrode is referred to as a "gate" because of its close analogy with the gate electrode in a field-effect transistor. This gate electrode allows control of the plating geometry of any metal or compound that would deposit near the metal plating potential by (a) setting a target cell chemical potential under a defined cell geometry (b) forcing stripping of deposited material from the gate through application of appropriate potential and (c) detecting the point where the gate can no longer be maintained at its target potential. This not only enables enhanced operation of metal-electrode or other cells, it also enables faster cycling in any cell whose potential lies close to the metal plating potential, and enables a range of novel cell designs in particular multi-electrolyte cells.

In another aspect, the gate electrode is both electrolytically and electrically conductive. In some embodiments, the electrolytic conductivity is achieved by making the gate electrode porous.

In another aspect, the gate electrode provides a porous mechanical barrier between the anode and cathode having a characteristic porosity sufficiently small so as ensure a high probability of contacting a non-uniform morphological feature extending from the anode towards the cathode before the non-uniform morphological feature creates a short-circuit between the working (node and cathode) electrodes.

In another aspect, the gate electrode is configured to be substantially geometrically parallel to at least one of the anode or cathode. In another aspect, the gate electrode is in communication with a circuit to detect deviations from the target potential with nearly 100% efficacy. In another aspect, a current may be applied to the gate electrode to strip non-uniform morphological features that have shorted to the gate electrode and recondition a cell prior to a catastrophic short-circuit between the working electrodes.

In another aspect, a monitoring circuit detects incipient faults that would progress to cell short-circuit. In another aspect, a reconditioning circuit functions to strip down non-uniform morphological features, thereby reconditioning the cell for continued safe use.

In one embodiment, the electrochemical cell is a secondary battery and the working electrodes include at least one anode and at least one cathode.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 10 (Prior Art) illustrates the construction of a battery using the cell of FIG. 9.

DETAILED DESCRIPTION

Discussion of Problems with the Prior Art

Figure 1:
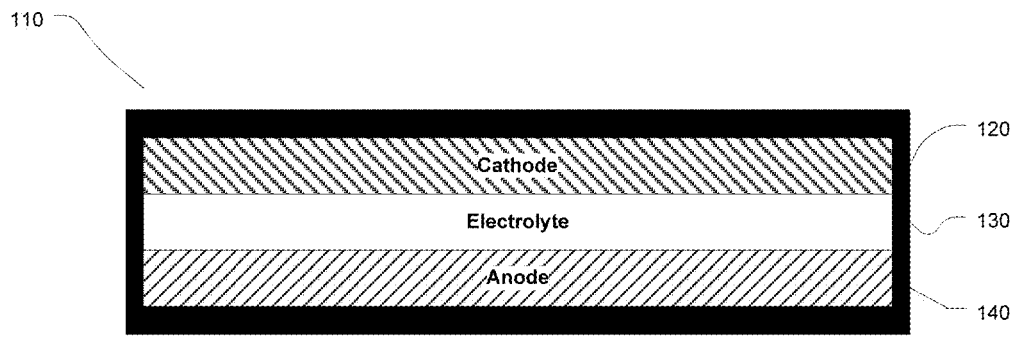
FIG. 1 (Prior Art) illustrates a basic electrochemical cell.

FIG. 1 (Prior Art) shows a "conventional," two-electrode secondary electrochemical cell 110, which includes a cathode 120, an electrolyte 130, and an anode 140. The cell produces a characteristic voltage based on the difference between the electrode potentials of the cathode 120 and the anode 140. The electrolyte 130 may have mechanical properties enabling it to function as a separator between the electrodes. The electrodes may be metallic or a combination of active and inert materials. During charging, electrons are generated at the cathode 120, and are consumed at the anode 140. The electrons are transferred via an external circuit. During charging of a typical metal-ion based cell, there is an accretion of metal-ions at the anode 140. In a cell with a metallic electrode, charging results in plating of the anode 140. In a cell with a non-metallic electrode, charging ideally results in intercalation of metal ions into the electrode, but if the intercalation potential is too close to the metal plating potential, metal may also plate in this instance.

Figure 2:
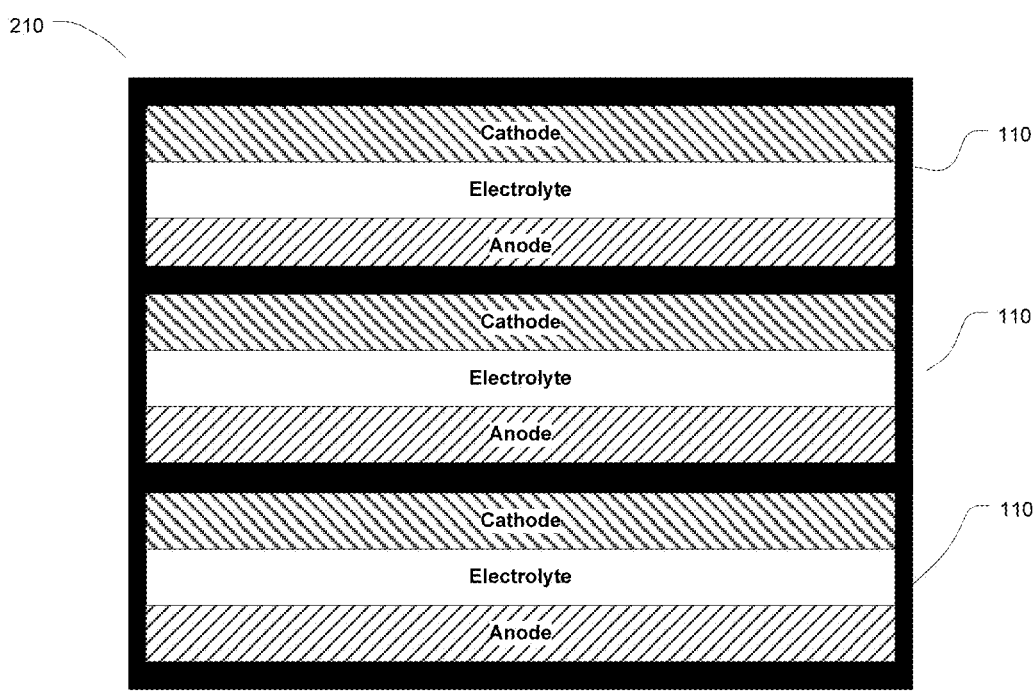
FIG. 2 (Prior Art) illustrates a battery constructed from at least two electrochemical cells.

FIG. 2 (Prior Art) shows that such cells 110 are typically stacked together to form a battery 210 that provides a multiple of the characteristic voltage. Some electrochemical systems are well suited to thin planar electrodes and electrolytes, and lend themselves to the construction of compact planar stacks of cells to produce higher voltage batteries in a small volume.

Figure 3:
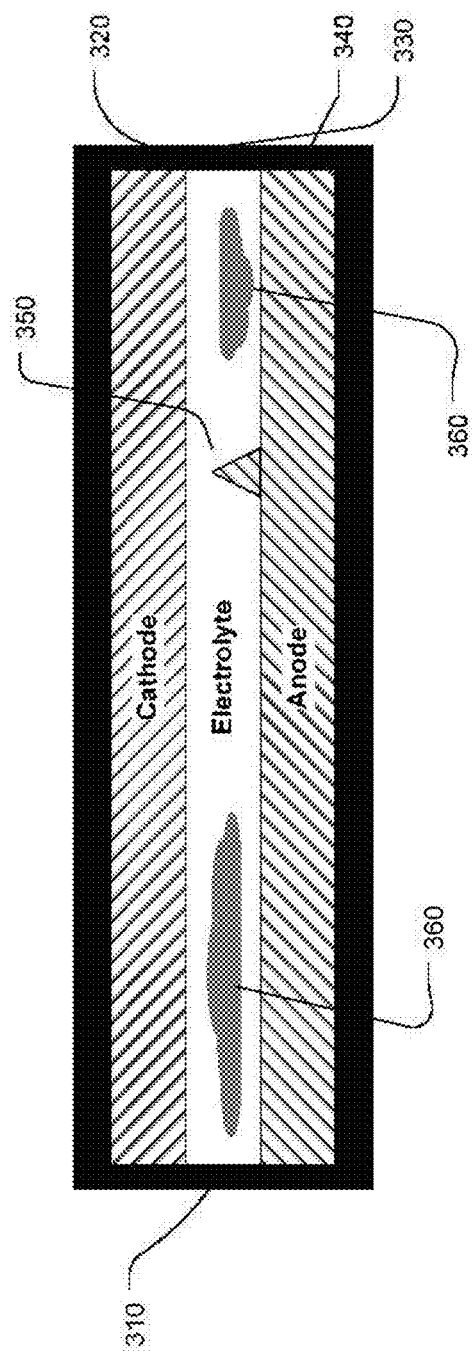
FIG. 3 (Prior Art) illustrates problems affecting cells, namely non-uniform morphological feature formation and the accretion of isolated metal complexes.

FIG. 3 (Prior Art) shows two serious problems that occur in secondary cells. The cell 310 contains the conventional cathode 320, electrolyte 330, and anode 340. During the charge/discharge cycle, it occurs that the geometry of the working electrodes can evolve to the detriment of the cell.

In particular, non-uniform morphological features 350, of metal may be formed on the surface of the anode 340. If the non-uniform morphological feature 350 grows sufficiently long to reach the cathode 320, the cell will short-circuit. This short-circuit disables the cell, and can also lead to a destructive exothermic reaction with catastrophic results. Another problem with conventional cells is that side reactions of the electrolyte 330 can lead to the formation of excess electrolyte interphase 360, called "mossy" deposits, within the interior volume of the cell, which creates isolated deposits of metal that is subsequently unable to participate in the operation of the cell. To some extent, the problems of non-uniform morphological features and mossy deposits can be managed by limiting the conditions of charge and discharge, but this limits the capacity and utility of the cell. It has also been suggested that material improvements to electrode materials could minimize the formation of non-uniform morphological features, but such improvements would still leave a cell vulnerable to eventual failure with no means of detection prior to a catastrophic event, and no way to repair the cell. Because no non-interfering way to detect incipient failures during normal operations is available for such cells, the only conclusive way to determine a cell failed due to dendritic shorting is the destructive disassembly of the cell during an autopsy.

Figure 4:
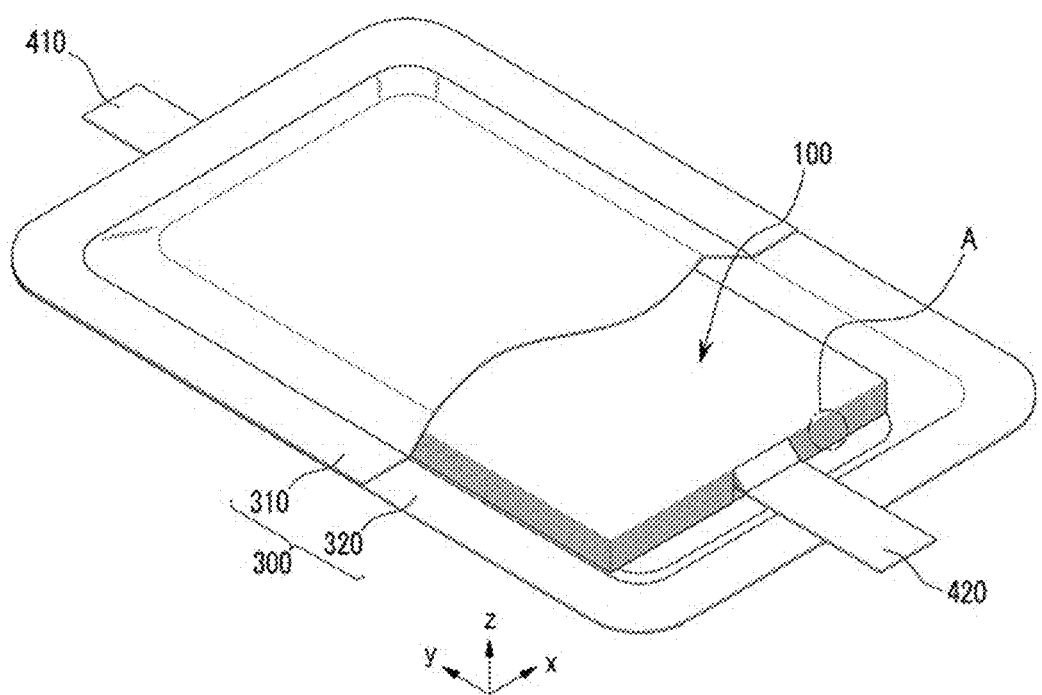
FIG. 4 (Prior Art) illustrates a battery with an inactive external electrode according to Roh.

FIG. 4 (Prior Art) illustrates a battery with an external electrode made of an inactive material according to Roh. Here, the one of the electrodes of a cell that is extended out of the active plane of the cell is used to provide interconnection points for composing cells into a battery assembly. The extended electrodes do not participate in the energy extraction or control of the cell. Inactive electrodes cannot be used to address the problems associated with non-uniform morphological features or mossy deposits.

Figure 5:
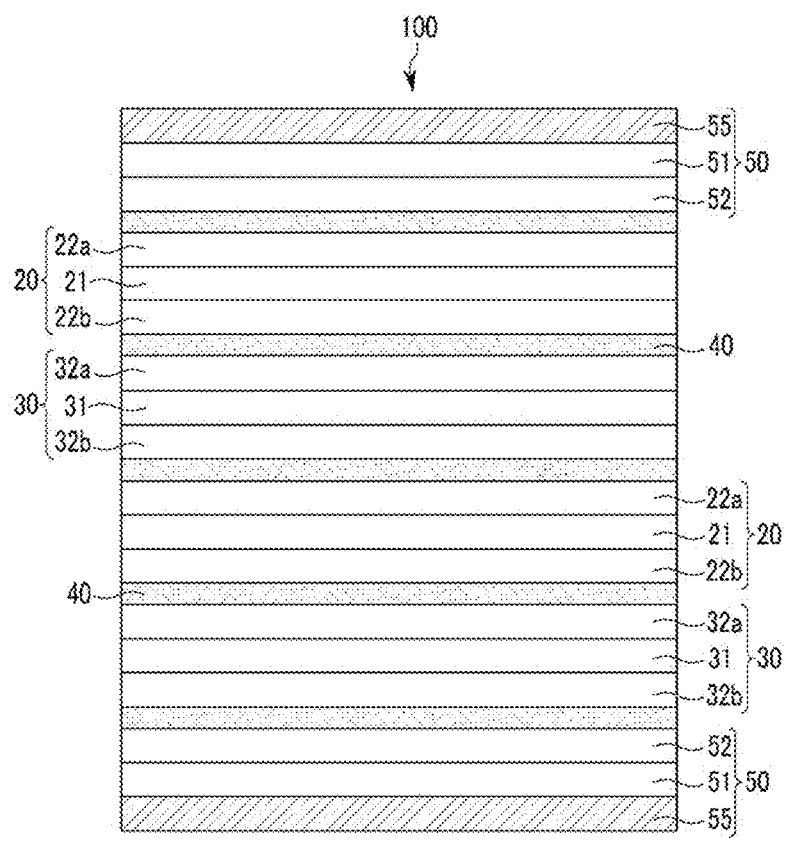
FIG. 5 (Prior Art) illustrates the internal construction of the battery of FIG. 4.

FIG. 5 (Prior Art) illustrates the internal construction of the battery of FIG. 4. A different material 55 from the active electrodes is used as a current collector and extended to provide cell interconnection points. While characterized by Roh as a third electrode, the assembly 50 having an active material 52, a collector 51 and an inactive material 55 are electrically equivalent to a single electrode. While providing mechanical advantages, this assembly cannot be used to address problems such as non-uniform morphological features or mossy deposits.

Figure 6:
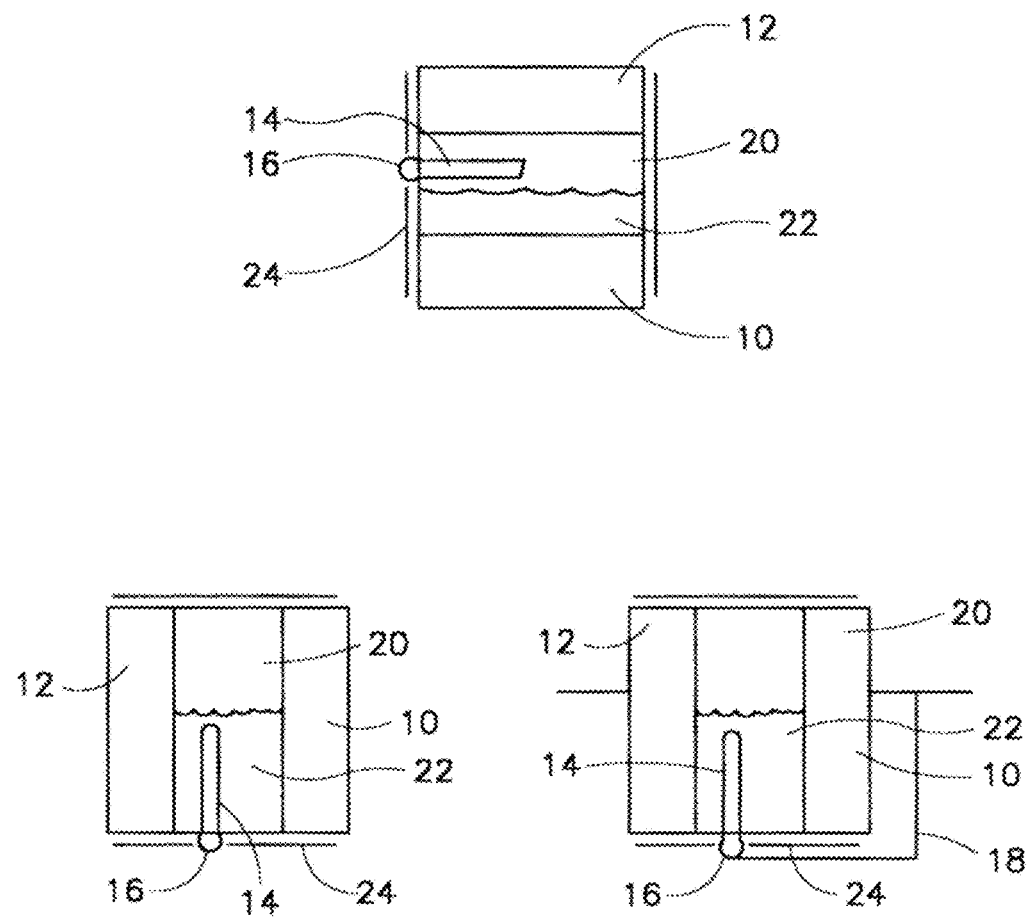
FIG. 6 (Prior Art) illustrates a liquid electrolyte cell with a third electrode according to Meissner.

FIG. 6 (Prior Art) shows a liquid electrolyte cell, according to Meissner, modified by the addition of an auxiliary electrode 16. As with Christensen, the auxiliary electrode disposed within the electrolyte 22 provides a reservoir for lithium for adding metal ions to the cell. The auxiliary electrode 16 is only intermittently in contact with the cell's liquid electrolyte, and does not participate in the normal charge and discharge cycle. The cell must be reoriented to control the auxiliary electrode's contact with electrolyte. The auxiliary electrode may provide some sensing function. The auxiliary electrode has an area substantially smaller than either of the working electrodes, and does not create a barrier between the anode and cathode. Because of these properties, the auxiliary electrode in Meissner cannot be used to address problems such non-uniform morphological features or mossy deposits.

Figure 7:
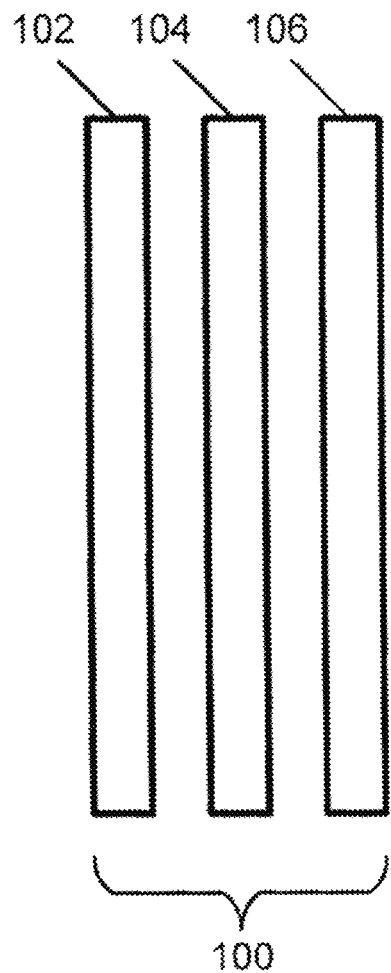
FIG. 7 (Prior Art) illustrates an air-electrolyte cell having a third electrode according to Zhong.

FIG. 7 (Prior Art) shows, as an example of another cell type has an air electrode 102 and a metal electrode 106. In addition, it includes a counter (third) electrode 104, a metal air tricell 100 according to Zhong. A third electrode has also been extensively investigated in this so-called "tricell" configuration for an air cathode. In these cells there are competing requirements for the catalyst during the oxygen-evolving and oxygen-consuming phases (charge and discharge). The tricell configuration addresses these different requirements by using two cathodes comprising different catalysts; for example a metal catalyst and an oxide catalyst. Since the goal of these schemes is to charge from one electrode and discharge to the other, the net current on one of the electrodes is always zero. Thus the counter (third) electrode 104 serves no sensing or reconditioning function, and thus cannot be used to solve problems such as non-uniform morphological features or mossy deposits even if this type of electrode was added to a non-air type cell.

Figure 8:
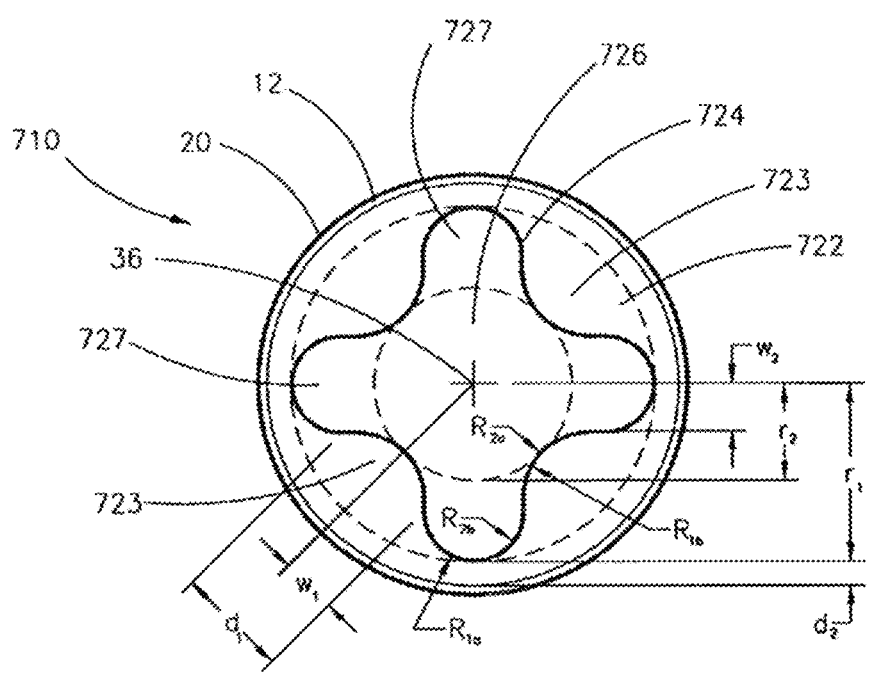
FIG. 8 (Prior Art) illustrates a cell according to Slezak having a third electrode to increase surface area.

FIG. 8 (Prior Art) illustrates a cell according to Slezak having a third electrode to increase surface area. The electrode has a folded shape and is directly connected to an internal electrode and is thus always at the same potential as the internal electrode. In this sense, the third electrode is not independent. The increased surface area improves the performance of the cell, but does not provide any active control or measurement capability, and thus cannot be used to address problems such non-uniform morphological features or mossy deposits.

Figure 9:
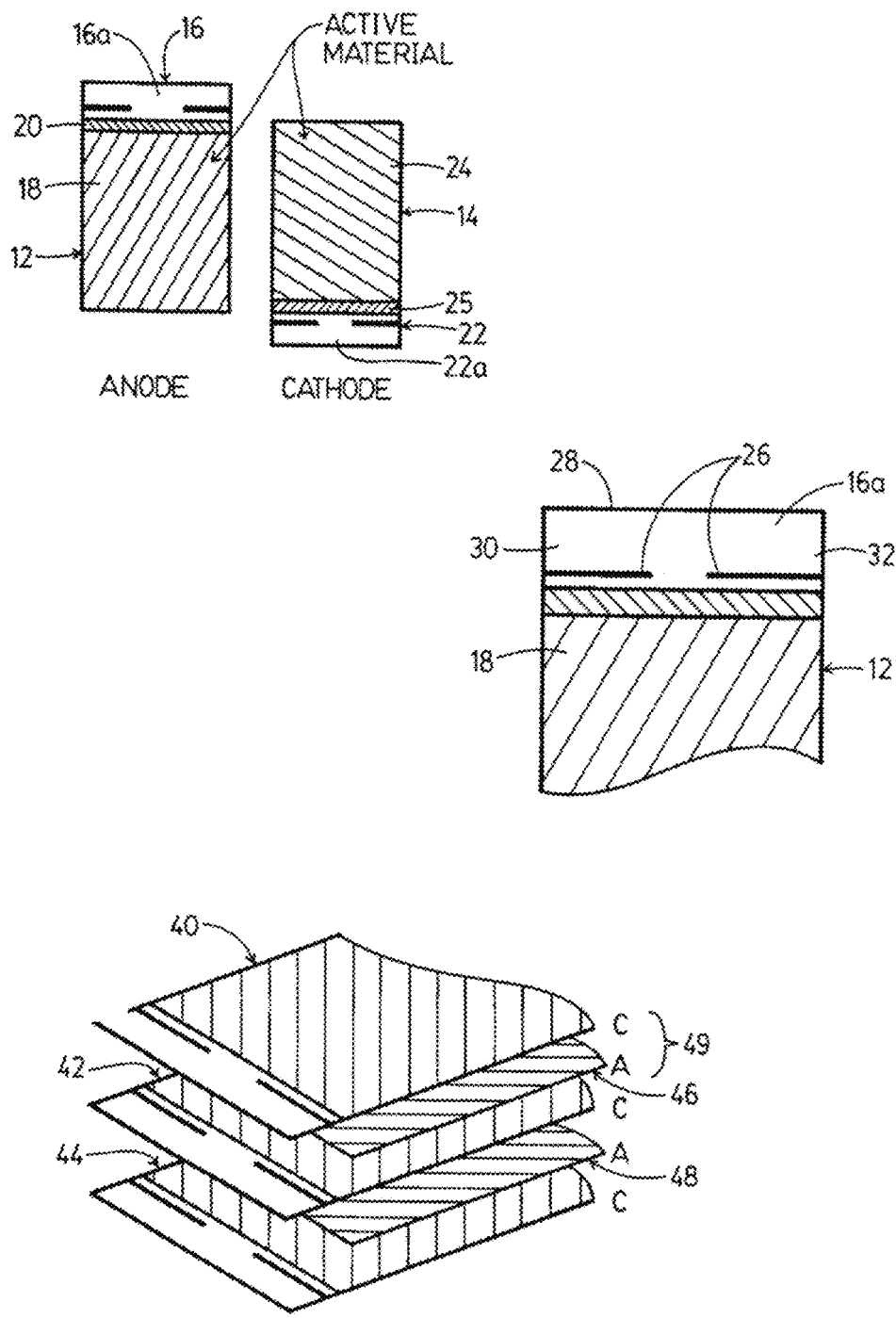
FIG. 9 (Prior Art) illustrates cells having an externally exposed extension of an electrode according to Morris.

FIG. 9 (Prior Art) illustrates cells having an externally exposed extension of an electrode according to Morris. Similarly to Roh, the extended electrode serves to provide external interconnects. In Morris, these electrodes do not cover the entire plane of the cell, and thus cannot provide a uniform active surface. The extended electrode cannot be used to address problems such as such non-uniform morphological features or mossy deposits. However, the extended electrodes allow a compact assembly of cells into a battery.

FIG. 10 (Prior Art) illustrates the construction of a battery using the cell of FIG. 9. The extended electrodes are used as current collectors and connect the individual cells with no increase the height of the cell stack. While the scheme of Morris provides mechanical advantages, the extended electrodes are electrically equivalent to the working electrodes and cannot be used to address problems such as such non-uniform morphological features or mossy deposits.

Figure 11:
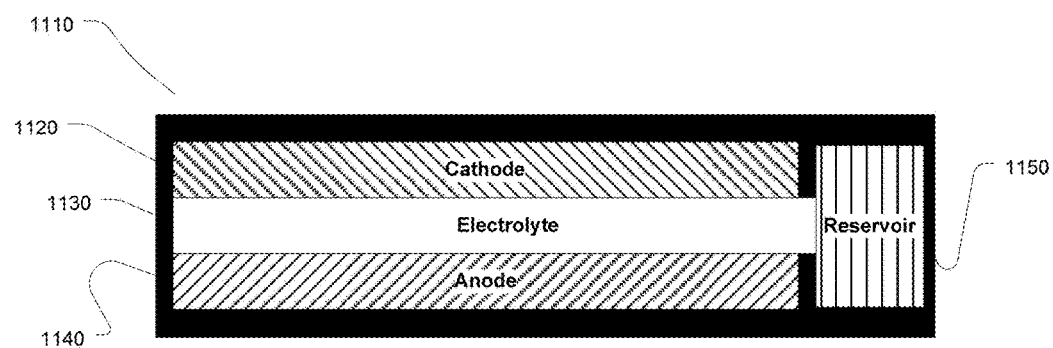
FIG. 11 (Prior Art) illustrates a three electrode cell where the third electrode is a non-participating metallic reservoir configured to replenish metal ions depleted by the mechanisms in FIG. 3.

FIG. 11 (Prior Art) shows a cell 1110, according to Christensen, incorporating a third electrode that provides a reservoir 1150 of metal in communication with an electrolyte 1130 to replace metal lost during charge and recharge cycle, providing the ability to "top up" the active Li in a cell. During normal operation the reservoir remains electrically disconnected from the operation of the cell. The reservoir is activated when degradation in cell performance has been detected and used as a source of metal to rebalance the cell's operation. Because the reservoir is designed not to interfere in normal cell operation, it is disposed out of the plane formed between the working electrodes (anode 1140 and cathode 1120), off to the side of the cell. The reservoir electrode is placed outside and adjacent to the primary conduction pathways of the cell but in contact with the electrolyte. The reservoir electrode is not coplanar with the remainder of the stack, and a bias is only intermittently provided to the reservoir electrode with respect to one or both of the working electrodes in order to replenish Li lost during cycling of Li-ion cells (as opposed to Li metal). While this approach can address the degradation in performance is identified by either "capacity fade" or "power fade" due to the effective loss of working ions, Christensen's reservoir cannot be used to address problems such non-uniform morphological features or mossy deposits for several reasons. First, the reservoir doesn't participate in the normal charge and discharge cycle, and is thus not able to monitor the state of non-uniform morphological features. Second, the reservoir is not located between the working electrodes forming a complete separator, so the cell could not be fully protected by any mechanical function the reservoir provided. Christensen also provides for monitoring by using the reservoir electrode as a reference or auxiliary electrode. During most of the cycle life of the cell, the reservoir electrode sits at open-circuit or operates as a sensing/auxiliary/reference electrode operating at minimal current. Only during charging or discharging is the reservoir electrode biased relative the anode (charging) or cathode (discharging) so as to introduce additional Li into the cycle. In order to function, the reservoir electrodes must deliver Li to the working electrodes, i.e. the average current between the reservoir electrode and the operating cell must be positive; likewise, the voltage during the operation of the reservoir electrode must also be positive.

Figure 12:
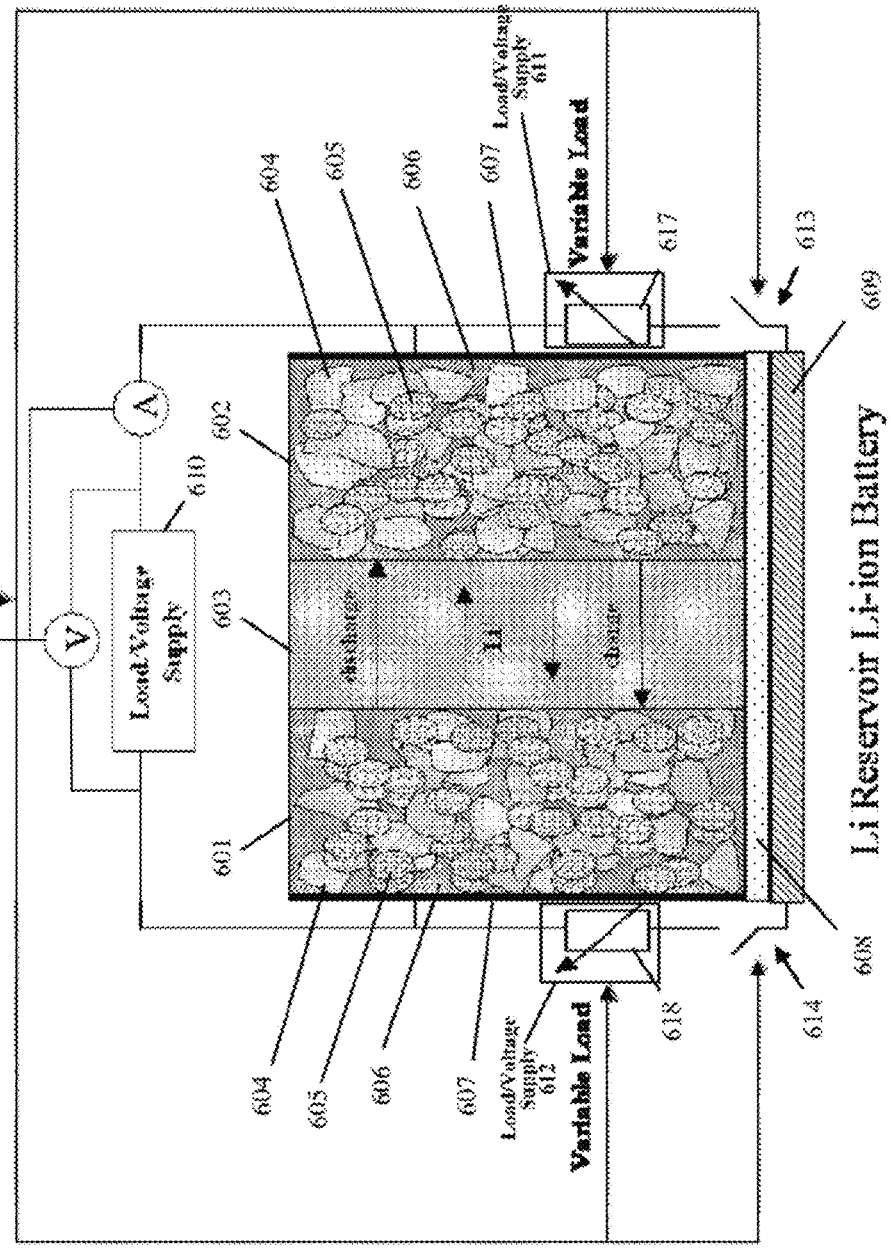
FIG. 12 (Prior Art) illustrates a cell with an intermittently connected Lithium reservoir electrode according to Christensen.

FIG. 12 (Prior Art) illustrates the cell of FIG. 11, and the control circuits which enable with the Lithium reservoir electrode to be intermittently connected when replenishment or reduction in the amount of Lithium cation is required. The Lithium reservoir electrode is in contact with the cell's electrolyte, but unless one of the switches 613 or 614 are closed from their normally open state, the Lithium reservoir electrode remains electrically isolated. When one of the switches is closed, and the correct voltage applied, Lithium can be added or removed from the active portion of the cell. This Lithium management function does not address problems such as such non-uniform morphological features or mossy deposits.

Figure 13:
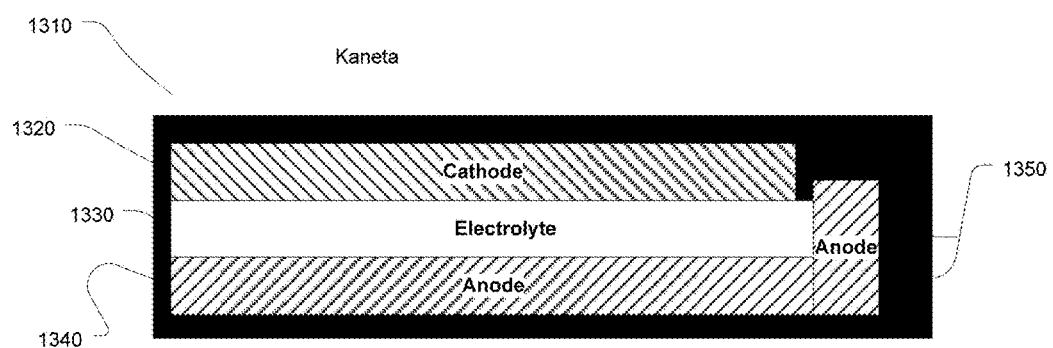
FIG. 13 (Prior Art) illustrates a cell where one of the electrodes is extended or electrically connected to a third electrode to provide non-interfering access to the cell for temperature or other measurements.

FIG. 13 (Prior Art) shows a cell 1310 according to Kaneta, where either the anode 1340 or the cathode 1320 is attached to an additional mass of electrode material 1350 that might be considered a third electrode. In this cell, the additional electrode material is mechanically and directly electrically connected to one of the working electrodes but mechanically disposed external the plane of the working electrodes. The additional electrode is not necessarily in direct contact with the electrolyte 1330. Thus, the additional electrode material is readily accessible as a measurement point such as, for example, for temperature, but is always operating at the same potential as the working electrode to which it is electrically connected. Therefore, the additional electrode material cannot be used for any purpose that does not assume a continuous connection to a working electrode. Because it is directly electrically connected to one or other working electrode, the additional electrode is not electrically distinct from the working electrodes, and cannot be used address problems such as such non-uniform morphological features or mossy deposits.

Figure 14:
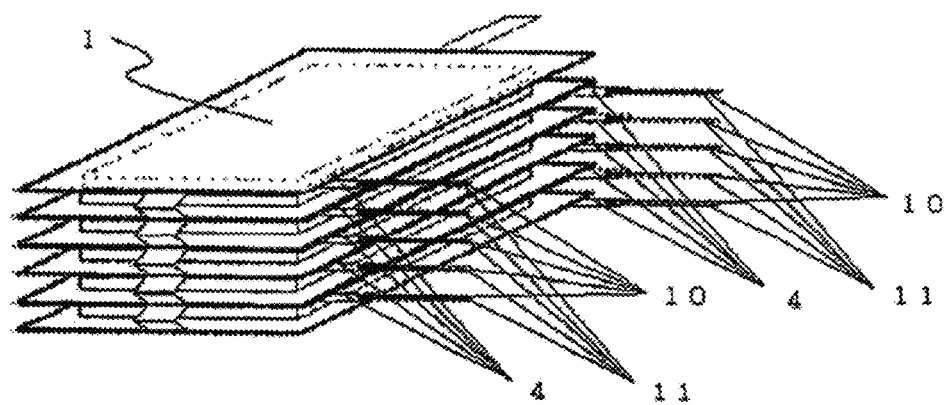
FIG. 14 (Prior Art) illustrates a battery according to Kaneta employing electrodes for sensing.

FIG. 14 (Prior Art) illustrates a battery according to Kaneta in FIG. 13 employing electrodes for sensing which extend directly out of the plane of each cell. The arrangement in Kaneta allows for sensing without the necessity of inserting sensing probes or adding thickness to the stack. However, the sensing electrodes do not participate in the energy storage or release chemistry of the battery, and cannot be used address problems such as such non-uniform morphological features or mossy deposits.

Figure 15A:
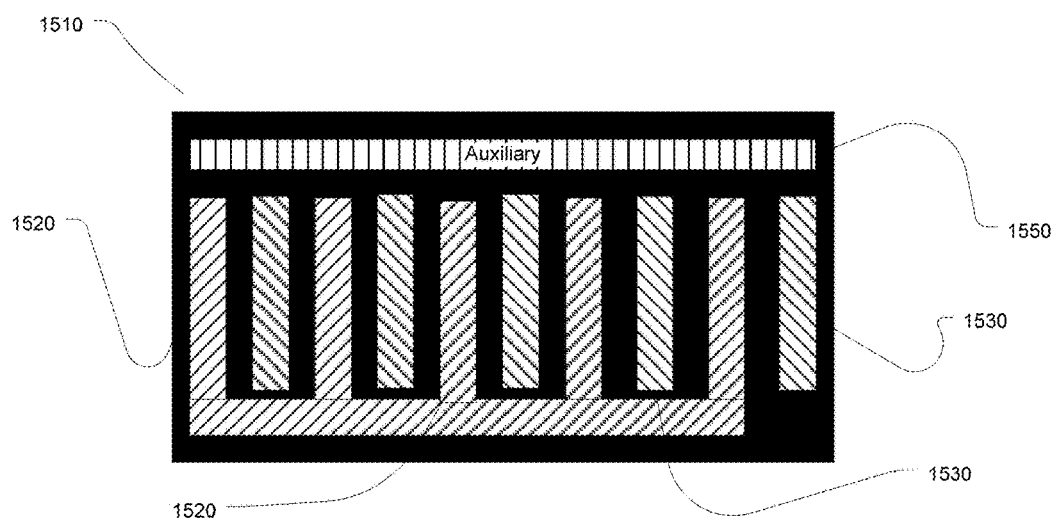
FIG. 15A (Prior Art) illustrates a cell according to Ramasubramanian with a three dimensional configuration of anode and cathode, with the addition of a third Auxiliary electrode that provides a reservoir for Lithium.

FIG. 15A (Prior Art) shows a three-dimensional cell 1510 according to Ramasubramanian. The cell has working electrodes anode 1520 and cathode 1530 having a non-planar geometry that provides a large surface area to increase the capacity of the cell. The auxiliary electrode 1550 of this cell is arranged to be in the relatively uniform proximity to at least one of the working electrodes, but is not located between the working electrodes, but is in contact with the electrolyte (not illustrated). The auxiliary electrode is able to carry significant currents, so as to support more uniform charging of the cell. Because of the three dimensional nature of the electrodes, the distance between the auxiliary electrode and the relevant working electrode varies substantially, limiting the utility of the auxiliary electrode only to functions unconcerned with local geometric evolution of the relevant working electrode. The auxiliary electrode is not located between working electrodes. Therefore, the auxiliary electrode cannot be used to manage local phenomena that occur between the working electrodes, and cannot be used to manage phenomenon related to non-uniform morphological features. Rather, Ramasubramanian is directed to optimizing charging and also toward using the auxiliary electrode as a lithium reservoir. The three dimensional cell of Ramasubramanian cannot be used to address problems such non-uniform morphological features or mossy deposits.

Figure 15B:
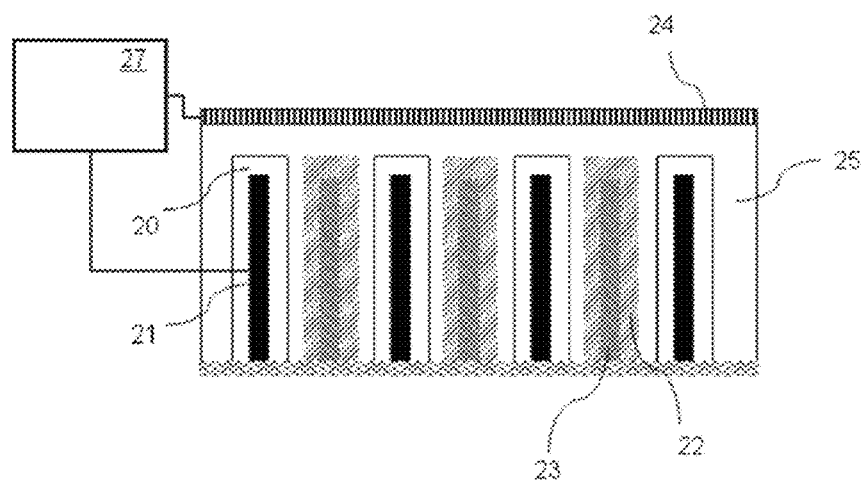
FIG. 15B (Prior Art) illustrates the cell of FIG. 15A and an associated sensing circuit.

FIG. 15B (Prior Art) illustrates the cell of FIG. 15A and an associated sensing circuit. The sensing and control unit 27 is used to maintain a desired potential of the auxiliary electrode 24 to improve the performance of the cell, but not to address such as non-uniform morphological features or mossy deposits.

Noguchi Prior Art

The Noguchi patent appears to disclose (as recited in a translation provided by the Korean Intellectual Property Office) that the electrically conductive layer (4) is made by forming a Cu layer of about 0.5 µm thickness on one side of a polypropylene sheet of 18 µm thickness using ion beam sputtering deposition, or in alternatives, RF or magnetron sputtering. After mechanical assembly, electrolyte was added to the secondary battery. It was then charged. After charging, the electric potential difference between the electroconductive layer and the cathode (16) and current can be measured.

The Noguchi patent is said to disclose (as recited in a translation provided by the Korean Intellectual Property Office) that the effect of the invention is to detect with high sensitivity internal short-circuits in lithium ion secondary batteries caused by foreign metal matter.

The electroconductive layer described is a passive device in that no potential is applied during operation of the cell. In fact the purpose of the electroconductive layer is to aid in the detection of manufacturing defects prior to shipment of the cell. The document specifically addresses the issue of short circuits created by the presence of metallic particle impurities that are introduced during the manufacturing process. Thus in actual operation of the cell (after shipment), no bias is applied nor current sensed. Further, the invention is described throughout as a means to detect internal short-circuits, detection being inherently passive and not affecting the device operation except to drive decisions regarding rejection of defective cells.

The Noguchi patent is said to disclose (as recited in a translation provided by the Korean Intellectual Property Office) that "Moreover, the electrically conductive layer (4) specially does not use after the shipment of the lithium ion secondary battery. Therefore the terminal (10) connected to the electroconductive layer is hidden to the member after the inspection before the shipment or the terminal (10) and the lead line connected to the electroconductive layer can be removed."

The Noguchi patent does not appear to describe how one might use the electrically conductive layer (4) to remove dendrites from a working Li secondary battery, or from any secondary battery. Rather, the Noguchi patent appears only to teach how one may detect manufactured secondary battery devices that are shorted and therefore are defective.

Figure 16A:
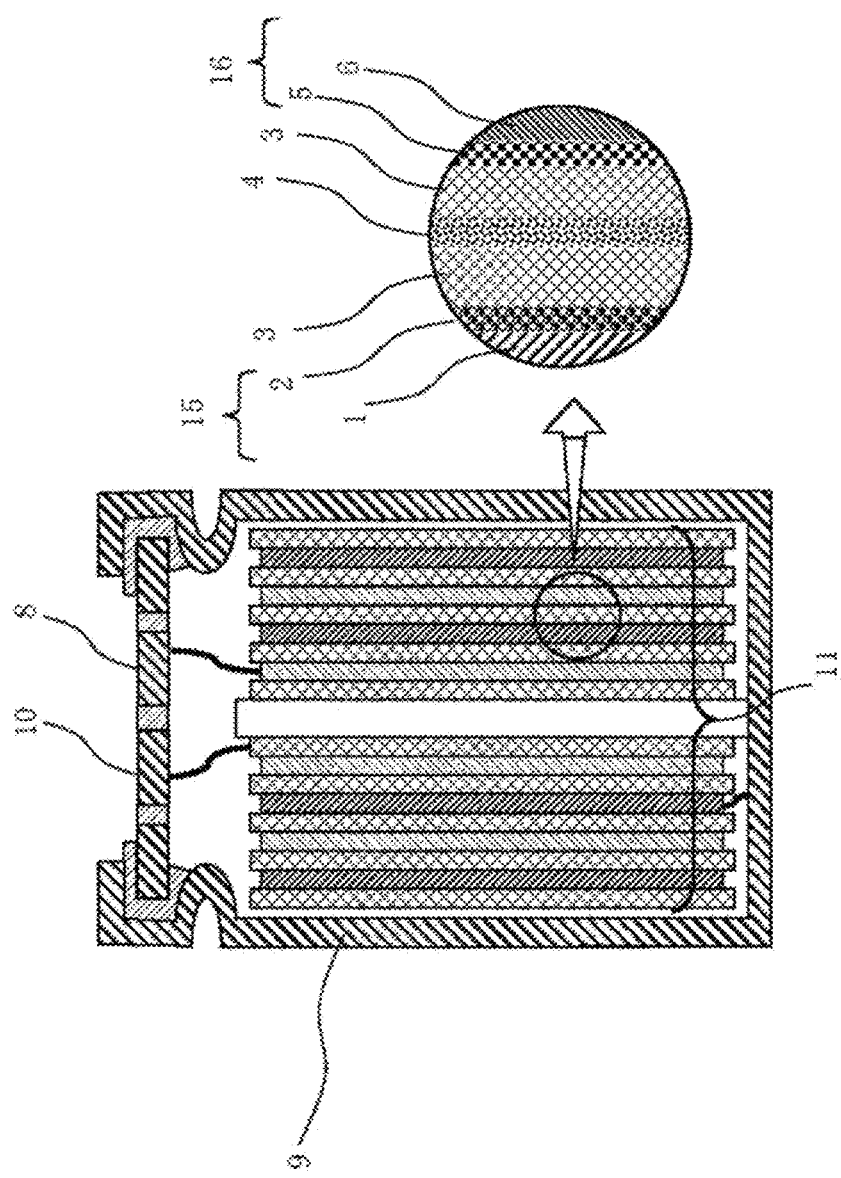
FIG. 16A (Prior Art) is a copy of FIG. 8 from Noguchi (WO 2011/070712 A1) showing the electrically conductive layer (4) that is not used after shipment of the lithium ion secondary battery.

FIG. 16A (Prior Art) is a copy of FIG. 8 from Noguchi (WO 2011/070712 A1) showing the electrically conductive layer (4) that is not used after shipment of the lithium ion secondary battery.

Cui Prior Art

Figure 16B:
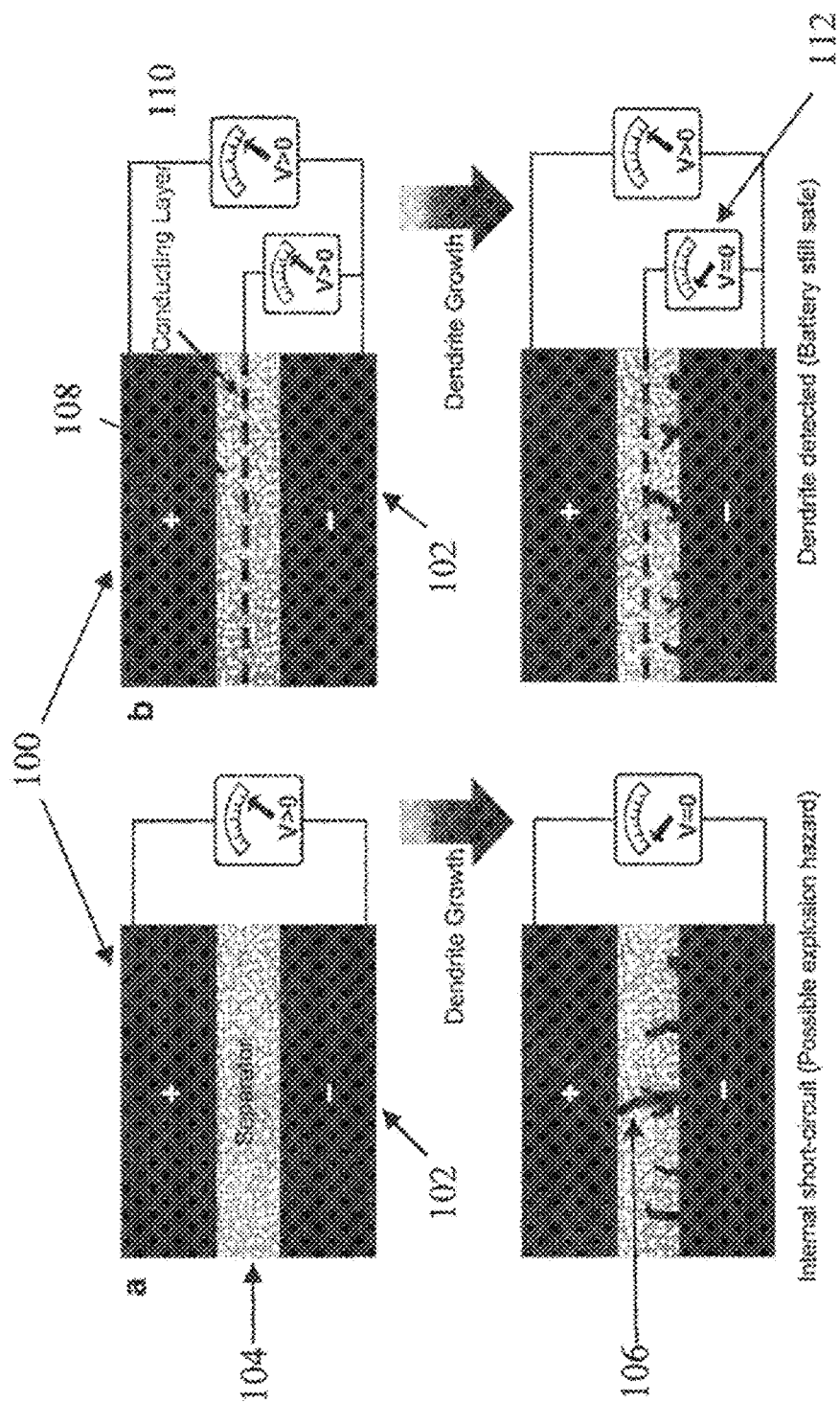
FIG. 16B (Prior Art) is a copy of the prior art FIG. 1a and FIG. 1b of Cui (PCT/US2014/036631).
Figure 17:
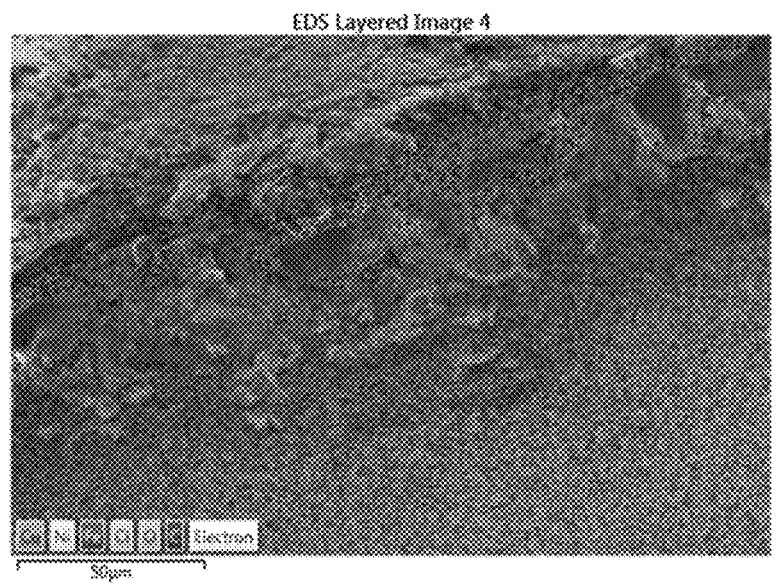
FIG. 17 illustrates a coated metallic electrode surface.
Figure 18:
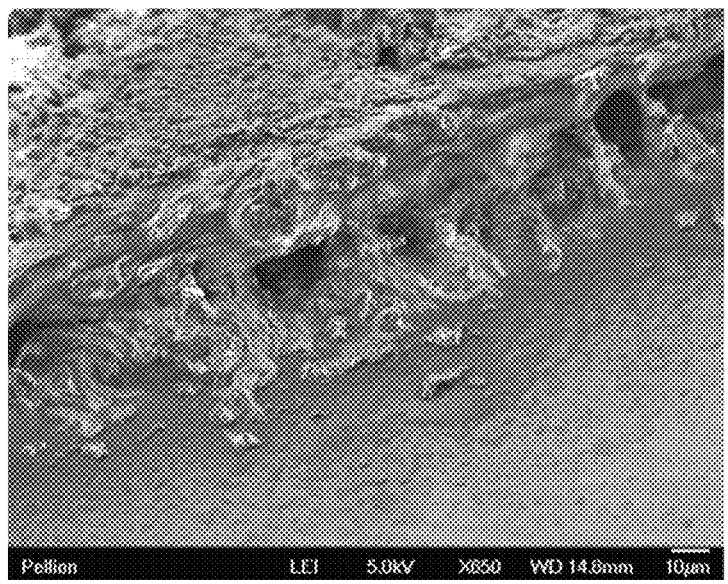
FIG. 18 illustrates the failure of the coating the electrode of FIG. 17 resulting in plating of the coating.

FIG. 16B (Prior Art) is a copy of the prior art FIG. 1a and FIG. 1b of Cui (PCT/US2014/036631).

In particular, Cui shows in FIG. 1a and FIG. 1b thereof the use of voltmeters to measure voltages between various electrodes in a secondary Li battery. As is well known in the electrical measurement arts, a voltmeter needs to have a high input impedance in order to avoid loading the circuit that is being measured. Meters with electronic amplifiers (all digital multimeters and some analog meters) have a fixed input impedance that is high enough not to disturb most circuits. This is often either one or ten Megaohms: the standardization of the input resistance allows the use of external high-resistance probes which form a voltage divider with the input resistance to extend voltage range up to tens of thousands of volts. High-end multimeters generally provide an input impedance greater than 10 Gigaohms for ranges less than or equal to 10 V. Some high-end multimeters provide greater than 10 Gigaohms of impedance to ranges greater than 10 V. Given that such meters operate from power supplies having operating voltages below 10 volts, and often lower than 5 volts, the current that would flow in sensing a short circuit (e.g., measuring a voltage of zero volts) would be less than $10^{-7}$ amperes with a meter having 10 Megaohm input impedance and less than $10^{-10}$ amperes with a meter having 10 Gigaohm input impedance, either of which is insufficient to have any effect on a dendrite in a secondary battery.

The device described in Cui is a passive device. The device is not configured to allow bias to be applied to the third electrode during operation of the cell. Instead of a current or voltage source applied to this electrode, the device contains a voltage-sensing device, such as a voltmeter. The operation of the voltage-sensing is inherently passive; the impedance of voltmeters is high so as to minimize interference of the sensing device with the operation of the circuit being sensed, and the voltage of all of the electrodes will remain at the same potential that they would be at in the absence of the sensing device. Because it is passive, the Cui invention like the Noguchi device may serve to reject defective cells but does not provide any improvement to the operation of the cell.

In summary, the use of more than two electrodes in electrochemical cells for a variety of uses is well known, but none of these prior uses can strip non-uniform morphological features or actively manage the health of the working electrodes.

Roumi Disclosures

Roumi, U.S. Ser. No. 14/546,953 filed Nov. 18, 2014 and published Jun. 18, 2015 as U.S. Patent Application Publication No. 2015/0171398 A1, and Roumi, U.S. Ser. No. 14/546,472 filed Nov. 18, 2014 and published Jun. 25, 2015 as U.S. Patent Application Publication No. 2015/018000 A1, both claim the priority and benefit of U.S. provisional patent application Ser. No. 61/905,678, filed Nov. 18, 2013, U.S. provisional patent application Ser. No. 61/938,794, filed Feb. 12, 2014, and U.S. provisional patent application Ser. No. 61/985,204, filed Apr. 28, 2014 (collectively "the earliest three Roumi provisionals"), prior to the filing date of U.S. provisional patent application Ser. No. 62/020,337, filed Jul. 2, 2014, from which the present application derives priority and benefit. The two Roumi applications also claim the priority and benefit U.S. provisional patent application Ser. No. 62/024,104, filed Jul. 14, 2014.

Under the present first to file legal regime, none of the additional material disclosed in either U.S. patent application Ser. No. 14/546,953 or U.S. patent application Ser. No. 14/546,472 that was not present in any of U.S. provisional patent application Ser. Nos. 61/905,678, 61/938,794, and 61/985,204 represents prior art to U.S. provisional patent application Ser. No. 62/020,337, filed Jul. 2, 2014, the priority and benefit of which application is claimed herein.

In the provisional patent applications mentioned above, Roumi does not describe or show any apparatus for applying a bias to a third electrode during operation of the cell.

U.S. provisional patent application Ser. No. 61/905,678, filed Nov. 18, 2013, describes that short circuits are sensed and potentially mitigated through the use of physical obstruction or thermal diffusion by employing mechanically robust composite separators or elastomeric current collectors that combine layers of conductive and insulative materials. However it does not provide any description of a cell comprising a separate third electrode, or a cell wherein three separate electrical signals between pairs of electrodes (i.e., between the positive and negative electrodes, between the positive and gate electrodes, or between the negative and gate electrodes) can be recognized, and modified or controlled. The application states that "it is important to note that the second active material does not need to be physically connected to the said current collector directly; and it doesn't need to be in complete physical contact with the said first active material at all times." It does not describe control of a cell utilizing more than two electrodes, within the cell, or at the circuit board, or any combination thereof. The conducting/insulating layers are simply a separator.

U.S. provisional patent application Ser. No. 61/938,794, filed Feb. 12, 2014, describes a conductive layer is "introduced into the space between opposite electrodes" as a method to control the surface of electroplated material. The inventor indicates that "the conductive layer may or may not be electronically connected to the opposing electrode. Further, the conductive layer may or may not be physically connected to the opposing electrode" hence the conductive layer is either isolated within the cell, or an additional conductive layer upon either the positive or negative electrode. This definition of the conductive layer is inclusive of the types of conducting materials that inadvertently find way into a finite number of defective cells produced during the manufacturing process. That application does not make any description of a cell comprising a separate third electrode, or a cell wherein three separate electrical signals between pairs of electrodes (i.e., between the positive and negative electrodes, between the positive and gate electrodes, or between the negative and gate electrodes) can be recognized, and modified or controlled. U.S. provisional patent application Ser. No. 61/985,204, filed Apr. 28, 2014 describes that short circuits are sensed and potentially mitigated through the use of physical obstruction or thermal diffusion in "an electrochemical cell . . . consisting of an anode, a cathode, an electrolyte, one or more separator layer(s) and an electronically conductive layer." The inventors claim "[t]he electronically conductive layer may have no electronic connections with one of the electrodes or may have no electronic connections with any of the electrodes." The application does not provide any description of a cell comprising a separate third electrode, or a cell wherein three separate electrical signals between pairs of electrodes (i.e., between the positive and negative electrodes, between the positive and gate electrodes, or between the negative and gate electrodes) can be recognized, and modified or controlled. In one aspect the conducting/insulating layers are simply a separator as defined by U.S. provisional patent application Ser. No. 61/905,678, filed Nov. 18, 2013, while in another aspect the definition of the conductive layer is inclusive of the types of conducting materials that inadvertently find way into a finite number of defective cells produced during the manufacturing process as defined by U.S. provisional patent application Ser. No. 61/938,794, filed Feb. 12, 2014.

U.S. provisional patent application Ser. No. 62/024,104, filed Jul. 14, 2014 presents the definition of the "low resistance conductive layer" specifically to ionic conductivity, rather than electronic conductivity as described in the present invention. For example U.S. provisional patent application Ser. No. 62/024,104 provides a description of "an electrochemical cell the separator consists of a separator-bag for the anode and the separator itself can consist of more than one layer; for example the separator-bag can be made of a strong porous or perforated layer (such as mylar film with 40% holes, hole sizes can be from nanometers to millimeters) covering the entire anode surface and a low resistant layer (such as nonwoven polyolefins) on the outer side away from the anode, facing the rest of the cell and the cathode." That application does not provide any description of a cell comprising a separate third electrode, or a cell wherein three separate electrical signals between pairs of electrodes (i.e., between the positive and negative electrodes, between the positive and gate electrodes, or between the negative and gate electrodes) can be recognized, and modified or controlled.

Roumi, U.S. patent application Ser. No. 14/546,953 filed Nov. 18, 2014 and published as U.S. Patent Application Publication No. 2015/0171398 A1 on Jun. 18, 2015, is said to disclose electrochemical cells including a composite separator capable of changing the performance of the cell by a) changing the internal electric field of the cell, b) activating lost active material, c) providing an auxiliary current collector for an electrode and/or d) limiting or preventing hot spots and/or thermal runaway upon formation of an electronic short in the system. An exemplary composite separator includes at least one electronically conducting layer and at least one electronically insulating layer. Another exemplary composite separator includes an electronically conducting layer and a solid ionic conductor. Also disclosed are methods for detecting and managing the onset of a short in an electrochemical cell and for charging an electrochemical cell.

U.S. patent application Ser. No. 14/546,953 describes a cell comprising a third electrode, or a cell wherein three separate electrical signals can be sensed despite the lack of such disclosure in any of the parent applications that it claims priority. It is notable that describing the "conductive layer" more like a third electrode and less like the composite separator previously described, this Roumi application shares similar description to Cui, et al., U.S. Patent Application Publication No. 2014/0329120 A1, published Nov. 6, 2014 (simultaneously with Cui, et al., WO 2014/179725 A1), which is said to disclose a battery that includes: 1) an anode; 2) a cathode; 3) a separator disposed between the anode and the cathode, wherein the separator includes at least one functional layer; and 4) a sensor connected to the at least one functional layer to monitor an internal state of the battery.

Therefore, the new material disclosed only in U.S. patent application Ser. No. 14/546,953 and not in any of the earliest three Roumi provisionals is not prior art to this application. However, for completeness, it is differentiated from the disclosure enclosed herein for the same reasons as Patent Application Publication No. 2014/0329120 A1.

Roumi, U.S. Patent Application Publication No. 2015/018000 A1, published Jun. 25, 2015, is said to disclose electrochemical cells including a separator enclosure which encloses at least a portion of a positive or negative electrode. In an embodiment, the separator generates a contact force or pressure on at least a portion of the electrode which can improve the performance of the cell. The disclosure also provides methods for charging an electrochemical cell.

U.S. patent application Ser. No. 14/546,472 filed Nov. 18, 2014 and published Jun. 25, 2015 as U.S. Patent Application Publication No. 2015/018000 A1 also describes the use of an active third electrode to "modify the performance of the cell by applying an external voltage". The Application discloses two such uses. First, [para 0060] the "application of voltage . . . can be used to "clean up" the cell". Examples are provided of specific examples of impurities and by-products in certain chemistries including which may be eliminated by the application of a voltage to this electrode "e.g. every 50 cycles". Further [para 0076], "the electronically conductive layer provides a source of active ions" which may be used "to compensate the ion loss or to make Li-ion cells with non-lithiated electrode". This appears similar to the Christensen Li "reservoir" and is differentiated from the present invention for the same reasons.

Therefore, the new material disclosed only in U.S. patent application Ser. No. 14/546,472 and not in any of the earliest three Roumi provisionals is not prior art to this application. However, for completeness, it is differentiated from the disclosure enclosed herein for the same reasons as Patent Application Publication No. 2014/0329120 A1.

Benefits Provided by the Present Invention

A technology that would enable the use of composite or metallic working electrodes would enable the capacity of batteries to increase. A technology that also allowed the use of metallic electrodes would provide the potential for performance improvements in many "next-generation" chemistries including without limitation not only Magnesium, but also Li-metal, Li-air, and Zn-air. In addition, a technology that would mitigate failure-modes, due to a change in the morphology of one or both electrodes that can lead to a short-circuit electrical condition, would allow for greatly enhanced performance in cells utilizing conventional intercalation host electrodes including, but not limited to graphite, or alloying, conversion, and disproportionation reaction electrodes. Even better would be a technology that allowed for batteries to be reconditioned from an incipient failure state, extending the life of a given battery. The present application provides systems and methods that address all of these desirable improvements.

Description of the Multi-Electrode Electrochemical Cell

A cell constructed and operated according to the present disclosure can actively prevent the formation of non-uniform morphological features by active control of the voltage or potential of a gate electrode. Further, the gate electrode can be used to provide a current to strip non-uniform morphological features down so that the cell may be restored to normal operation and the life of the cell can be extended. The current required to maintain the target voltage of the gate electrode also provides the ability to monitor cell health, and thus to actively manage the charging and discharging of the cell to optimize performance, capacity and to minimize the formation of non-uniform morphological features and "mossy" deposits.

Figure 19:
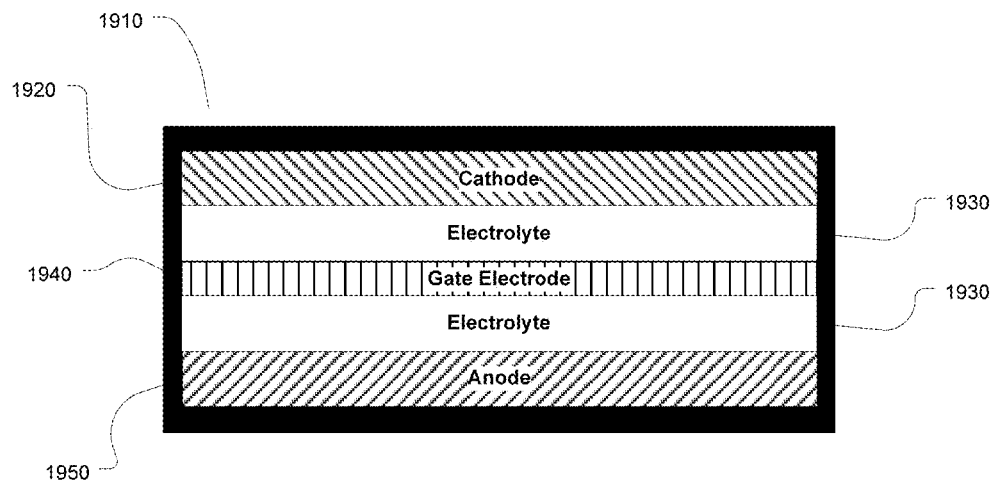
FIG. 19 illustrates a cell according to the present disclosure, which incorporates a gate electrode.

FIG. 19 shows a cell 1910 according to the present disclosure. This cell incorporates a porous gate electrode 1940 in contact with the electrolyte 1930, which is disposed between the cathode 1920 and the anode 1950. The gate electrode 1940, cathode 1920 and the anode 1950 are all arranged so that each is substantially parallel to one another on local scale. That is, the overall cell could contain complex curves, as long as the layers were locally parallel enough that the cell performed substantially as though the entire cell was planar. The gate electrode 1940 is located a distance from the anode 1950 such that a non-uniform morphological feature growing from the anode 1950 has an extremely high probability of contacting the gate electrode 1940. In one embodiment, in normal operation the gate electrode 1940 is set to be at a selected positive voltage relative to the anode 1950, for example by a control circuit. The voltage is selected such that it sets a local chemical potential which is sufficient to initiate stripping of plated metal, for example plated metal derived from at least one mobile species which is redox-active at at least one of the anode 1950 and the cathode 1920. The voltage required to initiate such stripping (e.g., a predetermined stripping potential) is well-established for a given electrochemical system. During normal operation, the gate thus provides a "guaranteed metal-free" zone where the local chemical potential of the cell prohibits the presence of metal. In the case that a non-uniform morphological feature on the anode touches the gate electrode, the tip of the dendrite will be shorted to the gate potential. Since there is now metal at its stripping potential, the non-uniform morphological feature will be stripped. The gate is connected to a current-source in order to accomplish this outcome, and during the brief period when there is contact between the gate and a non-uniform morphological feature, the current-source connected to the gate needs to supply a current of sufficient magnitude to perform this stripping operation. At other times, the current-source only needs to supply a current of sufficient magnitude to maintain the gate voltage at the metal-free potential.

In addition to maintaining a metal-free zone within the cell, the gate provides an ongoing measure of the cell's propensity for shorting. The current required to maintain the gate voltage is a measure of the number and size of incipient events which the gate is preventing. By maintaining the gate at a metal-free potential and measuring the current required to maintain that potential, it is thus possible to assess the likelihood of a shorting event occurring which will move the gate to the anode potential. If the gate shifts to the anode potential there is no longer a guaranteed metal-free zone within the cell, and the cell is at risk for shorting. Thus in some instances, at a point where a current required to maintain the gate at target potential exceeds some target threshold, it may be desirable to stop the cell from further cycling and remove it from service. This threshold may be chosen based on the size of the cell, the impedance of the anode and gate, and the undesirability of a cell failure in a given application.

In still a further implementation of this invention, a stripping circuit may be included which can be used in response to the changes in the gate current. In the event that a morphological feature contacts the gate electrode 1940, there will be an increase in the current required to hold the gate electrode 1940 at the stripping potential. This increase in the current may be observed, recognized and recorded. At this time, a control circuit may reverse the voltage applied to the gate electrode 1940 and the anode 1950 for a suitable time period, stripping down the non-uniform morphological feature. Thus the cell 1910 is protected from a fatal short circuit.

Figure 20:
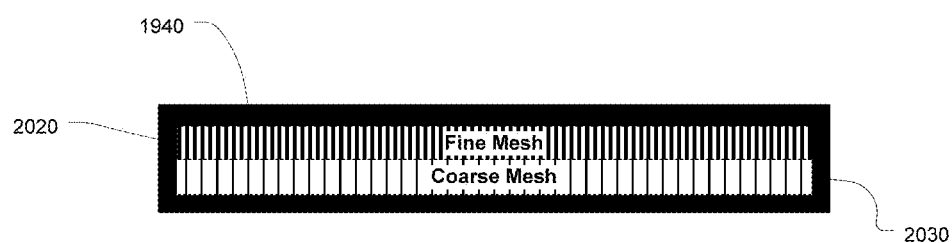
FIG. 20 illustrates a configuration of a gate electrode composed from a laminate of a highly conductive coarse mesh and a conductive fine mesh.

FIG. 20 shows an embodiment of the gate electrode 1940. To function appropriately, the gate must allow for electrolytic conduction across its thickness and be an electrical conductor along its length. Electrolytic conduction is necessary because the gate electrode 1940 is disposed between a cell's working electrodes and should be as transparent as possible in normal operation. One method for allowing electrolytic conduction is to arrange the structure of the gate to be freely porous to whatever electrolyte is being used in the cell. The gate electrode must be electrically conductive in its plane so that it may be used to measure local voltage in idle mode, and be used to deliver current to the anode in stripping mode. The structure of the gate, while porous, needs to have a sufficiently fine pore structure so that a non-uniform morphological feature passing through the structure has a very high probability of making electrical contact. One way to provide porosity and still not allow a non-uniform morphological feature to penetrate the gate electrode is to make the porous channels tortuous or non-linear in geometrical extent as one passes from one side of the gate electrode to the other side. In a non-limiting example, these goals can be achieved by laminating a highly conductive coarse mesh 2030, capable of delivering an appropriate stripping current, with a conductive fine mesh 2020 whose pores are too small for a non-uniform morphological feature to pass though without contact. The laminated gate has favorable mechanical and electrical properties, while providing the spatial fineness to ensure the gate can prevent incipient faults from non-uniform morphological feature growth. In particular as shown in FIG. 24B, the gate resistance $R_{gate}$ should be made smaller than the resistance of a non-uniform morphological feature $R_{numf}$ so that the non-uniform morphological feature can be stripped.

Figure 21:
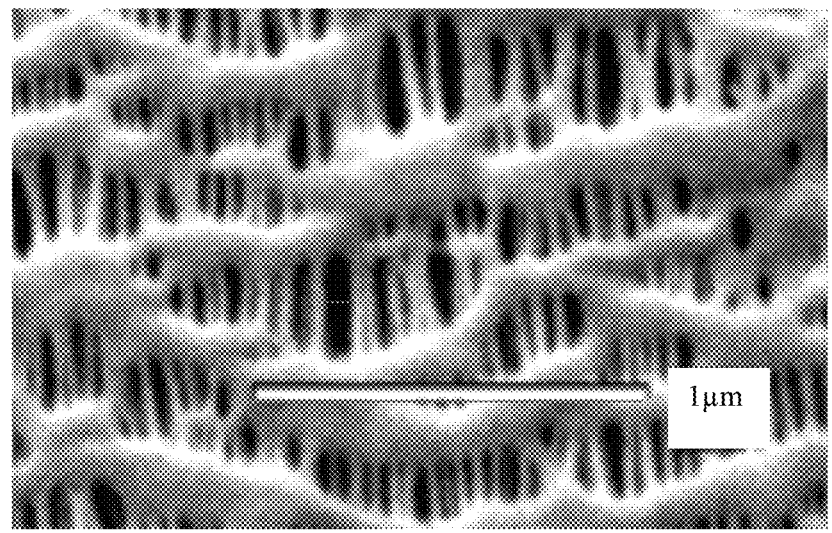
FIG. 21 shows a commercial separator treated with a thin metal film.

FIG. 21 shows a potential implementation of a gate electrode comprising a commercial separator treated with a thin metal film. The commercial separator is a polymer based layer that is electrically insulating and has fine pores that allow electrolyte flow between the working electrodes. These pores are sufficiently small that it is highly improbable that a non-uniform morphological feature could pass through the mesh without making physical contact with the material. A wide variety of such materials are well known in the art and are used in the vast majority of commercial cells. The commercial separator is a starting point for the gate electrode, and can be added to the cell parallel to the working electrodes disposed between the working electrodes so as to completely separate the working electrodes. However, as supplied, the commercial separator material is not useful for protecting the cell from the previously mentioned failure and degradation modes, because the impedance of the separator is effectively infinite, so that in the event that a non-uniform morphological feature contacts such a gate, the local gate potential would move to the plating potential and the non-uniform morphological feature would continue to grow. Therefore, a thin metallic plating is applied to the mesh. After this treatment the separator mesh can be attached to a current-supply circuit, and the impingement of a non-uniform morphological feature can be prevented. Such a treated separator may be sufficient. However in some non-limiting embodiments, this metalized mesh has insufficient conductance to achieve the goals of the present disclosure because the mesh is not conductive enough.

Figure 22:
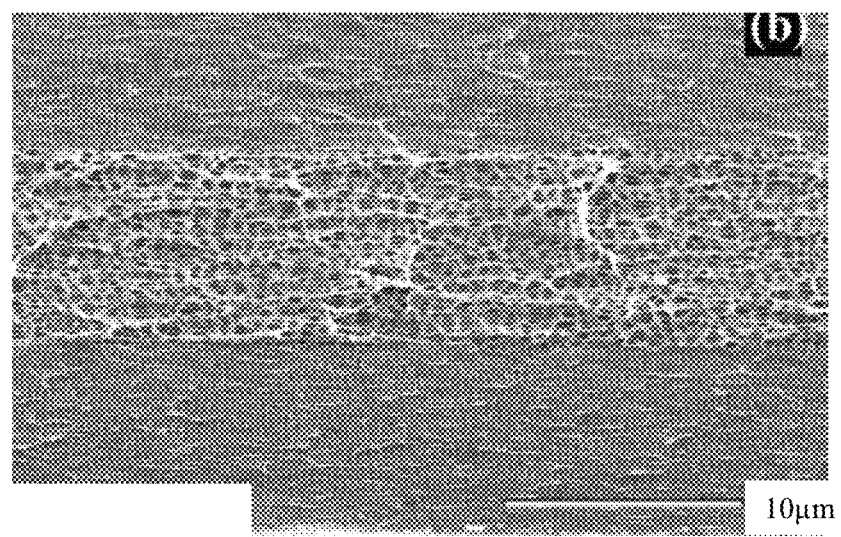
FIG. 22 shows a thin metal coated separator combined with a thick metal grid.

FIG. 22 shows an alternative embodiment, where a thin metal coated separator combined with a robust metal grid. The metal grid is highly conductive and has sufficient current carrying capacity to strip undesired non-uniform morphological features off of a working electrode. In some non-limiting embodiments, the grid's filaments are too far apart to ensure that a non-uniform morphological feature would make contact with the grid while passing through the grid. Consequently the grid alone may be insufficient to achieve the goals of the present disclosure. By laminating the metalized mesh of FIG. 21 with the thick metal grid, a composite structure with excellent properties is created.

Whether made from a homogeneous or composite, as in the embodiments described above, any structure that is, for the given working conditions of the cell, 1) ionically conductive, 2) has a pore size small enough to ensure contact with a non-uniform morphological feature growing off of a working electrode towards the center of the cell, 3) highly conductive so that energy is not dissipated in the laminated structure and 4) has high current carrying capacity may be sufficient to support reconditioning operations.

Operation of the Cell

We describe a range of potential operating modes for a battery management system for a device comprising a gate electrode. In. various embodiments, there may be a very wide range of operating modes because of the very wide range of battery applications with very different requirements for safety and power consumption.

The battery management system (BMS) comprises an electronic or software control system that controls the battery voltage as it cycles between charge and discharge states. A BMS may comprise a manual operator observing voltages and currents and causing the application of appropriate potential differences between selected electrodes to bring the system to a desired operational state. In its simplest implementation the BMS may contain no internal electronics: when the voltage applied across the battery is high enough, the current flows so as to charge the battery; when the voltage drops (i.e., a load is applied) the battery discharges. However, in the vast majority of present commercial batteries there is some additional electronic circuitry. The purpose of this electronic circuitry may be, for example, to actively control how rapidly the voltage may increase during charge, or to limit leakage during stand-by or open-circuit operation. A portion of exemplary BMS control circuitry for a small commercial Li-ion cell is shown below from U.S. Pat. No. 6,002,239, although a wide range of similar and related devices may be used. The purpose of the "voltage comparator" mode in U.S. Pat. No. 6,002,239 is to avoid metal plating and thus non-uniform morphological features in an overvoltage condition. In more complex systems, such as mobile phones or other portable electronic devices, the BMS may comprise a computer-based implementation, such as a PMIC (power management integrated circuit) operating under the control of software (e.g., a set of instructions recorded on a machine-readable medium) with current- and voltage-sensing components. In such embodiments, the role of the operator in "observing" currents and voltages can be accomplished by suitable instruction provided as software or as firmware.

Operating Modes for Devices According to the Invention

We describe an embodiment that uses a manual realization with switches, and briefly outline the extension to automated operation using electronic or software controls.

During charge, the risk of device shorting due to non-uniform morphological features is at its maximum, so the gate current is monitored closely for shorts. In the event that the current between the cathode and the gate electrode exceeds a predetermined threshold, a "cell health" event may be triggered. In a further implementation the gate voltage may be monitored for a shift away from the targeted potential. In yet a further implementation, if the voltage response to a sense voltage signal between the gate electrode and anode increases (i.e. the resistance decreases) a "cell health" event may be triggered. The trigger voltage, current or resistance may be determined based on the natural open-circuit voltage of the gate electrode. The open circuit voltage is a function of the electrochemical potential in the electrolyte and of the gate electrode materials. Additionally, the trigger event may be a function of the charging current and state-of-charge of the anode, and the resistance of a typical non-uniform morphological feature in the particular electrochemical materials system. Selection of threshold voltage, current or resistance may be based on theoretical projections of non-uniform morphological feature behavior or may be based on experience. In yet another implementation, the "triggering current" for a "cell health" event may be based on empirical studies of the correlation between current required to maintain the gate at target potential and actual cell failure events in the selected cell, or in a sufficient number of similar devices that a statistical analysis yields a high enough confidence level (i.e., 90%, 95%, 99%, 99.9%, or higher). In still a further implementation, a "cell health" may be assessed based on an impedance or voltage measurement that corresponds to such a triggering current.

In the event of a "cell health" event being detected, the operator may trigger one of several possible remedial steps. The simplest remedial step is to trigger an alarm, terminate the cell charging process, and discard the battery. This will prevent a battery from being further charged once the current required to maintain the gate at its target potential exceeds the threshold, i.e. "cell health" is deemed to have deteriorated to an unacceptable level. In some embodiments, a controller comprising a general purpose programmable computer that operates under a set of instructions recorded in a machine-readable medium, or alternatively a dedicated control circuit, may be used in place of a human operator.

Alternatively, the recognition of a cell health event may trigger one of several possible "deshorting" steps. One option may be to apply a voltage differential between the gate electrode and the anode that moves the gate electrode above the stripping potential of the metal. Both the potential and the duration for which the potential is applied may be adjusted. Another option may be to cease charging and switch the cell into discharge mode. This discharge step may use a ballast load device to dissipate the cell energy. Alternatively the discharge step may use the discharge of a shorted cell to charge another cell in a battery pack comprising a plurality of cells. The applied deshorting voltage or current may be predetermined so as to bring the gate electrode to the required voltage even in the presence of a "worst-case" non-uniform morphological feature. In another implementation, the deshorting procedure may be determined by finding the voltage (or current or pulse duration) required to achieve a targeted (near-zero) current between the gate electrode and both the anode and the cathode. In yet another implementation, the deshorting procedure may be determined by identifying the pulse duration (or voltage or current) required to achieve the targeted voltage between the gate electrode and either the cathode or anode (this targeted voltage being close to the open-circuit voltage for the gate electrode material with respect to the other electrode). In still a further implementation, the detection of a short may trigger a change in the cycling voltage, so that the cell continues to cycle but with a modified voltage window. Once the non-uniform morphological feature is stripped, the current required to maintain the gate electrode at the target voltage will drop to near-zero; however after a shorting event that plates metal onto the gate electrode, it will frequently be desirable to continue to apply a discharge voltage between the gate electrode and the cathode until the gate electrode voltage reaches its open-circuit potential. In an embodiment involving a plurality of gate electrodes, the deshorting procedure may use one of more of the gate electrodes as an anode in the shorting process, so that stripped metal is sacrificially deposited onto said anode.

During open-circuit operation, the risk of non-uniform morphological feature shorting should be lowered, but it may still be advantageous to maintain the voltage at the gate electrode while monitoring the current required to maintain voltage. Options for remedial actions in the event of a short being detected will generally be similar to those taken in the event of a short during charging (although the circuit implementation may be different because an external power supply need not be connected).

During discharge operation, the risk of shorting is again lower than during charge, but it may again be advantageous to maintain the gate electrode at target voltage while monitoring cell health through the current required to maintain potential.

For battery packs utilizing multiple cells the operation of the gate remains roughly unchanged. However, an additional option to monitor cell health by measurement of the voltage or current with respect to other cells in the pack is possible. For example either the voltage or the current at a gate electrode may be compared to adjacent gate electrodes either in the same string or in a string connected in parallel. A cell health event can then be triggered by a discrepancy between different ones of otherwise similar gate electrodes. Similarly the remediation may include alarming and discarding the entire pack, alarming and isolating a single string in a multi-string pack, or discharging a single string in a pack by charging neighboring strings, in addition to all the single-cell remediation approaches discussed above.

Implementation of these operating modes may be through the manual process discussed here. Alternatively, a variety of circuit elements may be used to achieve the same goals (comparing voltages, currents, and resistances and responding by switching voltages, loads and currents within the circuit) without manual intervention. The circuit elements of relevance in such implementation are well known in the art. The thresholds for triggering a shorting event (whether measured as any of currents, voltages or resistance) may in such a case be implemented through comparison with suitable voltage, current or resistance references such as physical references or reference values recorded in a machine-readable medium, or by triggering an active circuit in response to a voltage or voltage difference, or through some combination thereof. Alternatively, the operating mode may be implemented through a set of instructions recorded on a machine-readable medium (i.e., software) operating on an existing BMS or PMIC (most of which already contain sufficient physical-layer controls to permit the recognition and response or control function discussed herein). The thresholds for triggering a shorting event (whether measured as any of currents, voltages or resistance) may in a preferred embodiment be stored in a look-up-table held in semiconductor memory.

Figure 23:
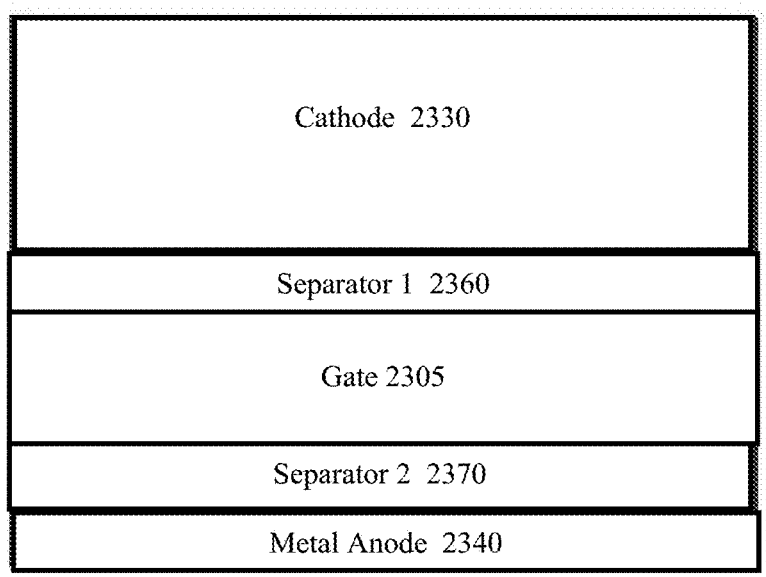
FIG. 23 illustrates an embodiment of a cell having an anode electrode, a cathode electrode, and a gate electrode which incorporates a gate structure with separators.

FIG. 23 illustrates an embodiment of a cell having an anode electrode 2340, a cathode electrode 2330, and a gate electrode 2305 which incorporates a gate structure with separators 2360 and 2370, and an electrolyte.

We now describe the typical operating conditions for the cell illustrated in FIG. 23. Specifically, the gate 2305 is held high in normal operation such that it does not participate in any plating. The charge rate on the cell is limited to ensure high performance, and preserve the condition of the anode 2340. In a maintenance mode, a small resting trickle-charge from the gate electrode can be provided by holding the gate electrode approximately 0.1V over the anode voltage. During discharge, the gate electrode 2305 is held approximately 0.1V below the anode so that the gate electrode does not participate in the discharge.

Figure 24:
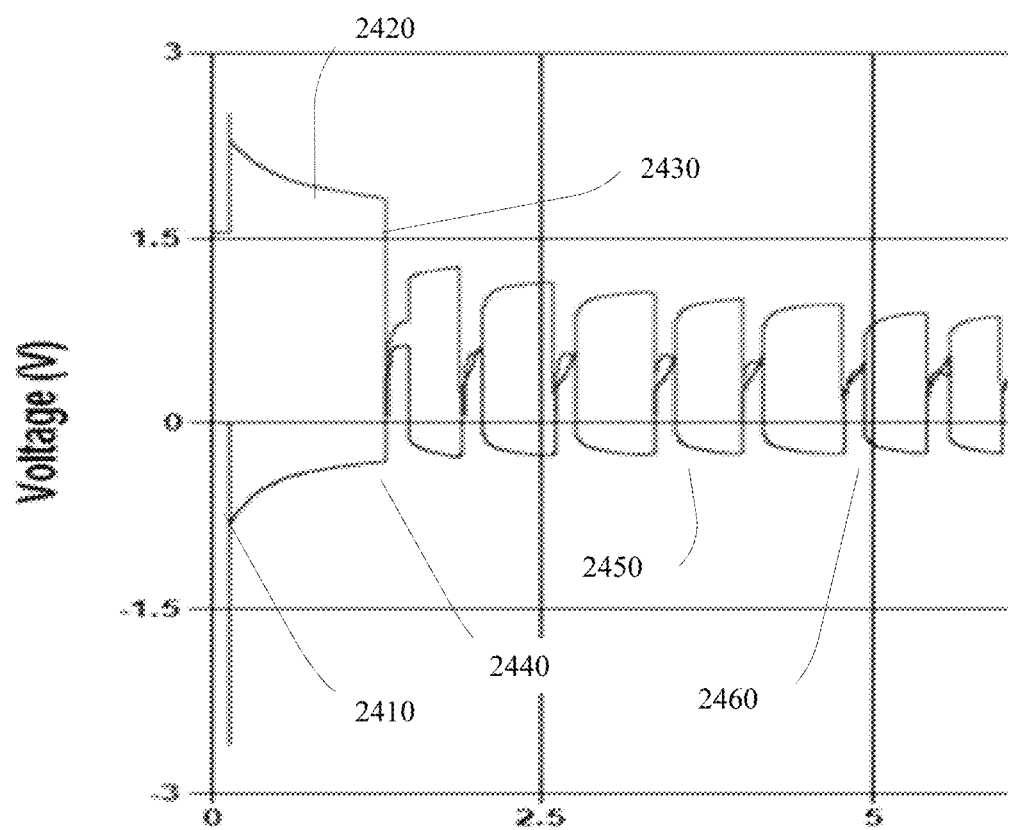
FIG. 24 illustrates a cell charge, discharge and stripping cycle.

FIG. 24 shows how the gate electrode can be used to measure cell conditions and controlled to subsequently correct non-uniform morphological feature formation prior to a catastrophic short-circuit of the working electrodes. In particular, during a normal charging phase, the anode operates (see curve segment 2410) at approximately −0.5V, while the gate electrode is held at about 1.5V in an "idle" state (see curve segment 2420). If a non-uniform morphological feature contacts the gate electrode, the short to the anode drops the voltage closer to the anode voltage (see curve segment 2430). (The actual voltage measured at a shorted gate electrode depends on the resistance of the non-uniform morphological feature and the resistance of the gate electrode itself). However, this shorts only the gate electrode, not the entire cell, so there exists the opportunity to apply a negative voltage to the gate electrode to "strip" down the non-uniform morphological feature (see curve segment 2440). Once this is done, the normal charging of the cell can continue (see curve segment 2450). This process can be repeated many times (see curve segment 2460) to extend the life of the cell and to operate the cell safely.

Figure 25:
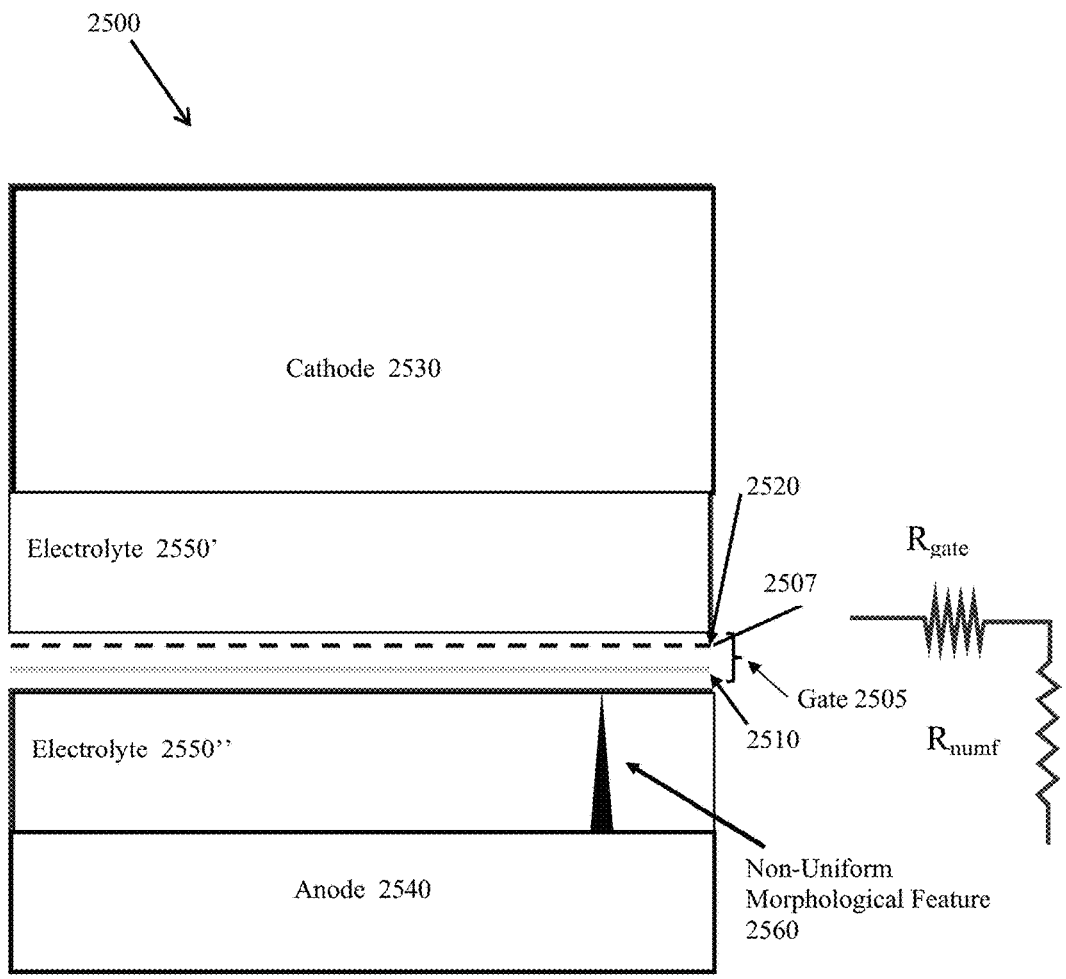
FIG. 25A illustrates a method of detecting an incipient cell short, and responding to such detection with a reconditioning step, and the resistance requirements for the proposed gate electrode versus the affected working electrode.
FIG. 25B illustrates the operating voltages for the gate relative to the working electrodes.

FIG. 25A illustrates a method of recognizing an incipient cell short, and responding to such detection with a reconditioning step, and the resistance requirements for the proposed gate electrode versus the affected working electrode. In FIG. 25A there is depicted an electrochemical cell 2500 having a gate electrode 2505 that is both gate electrode is both electrolytically and electrically conductive comprising a support 2510 that is ionically conducting and an electrically conductive layer 2520 provided on the support. The gate 2505 has a gate electrode electrical terminal 2507 that can be accessed from the exterior of the cell. The cell 2500 in FIG. 25A has a cathode 2530 and an anode 2540 that are separated by the gate electrode 2505. Electrolyte 2550', 2550" is provided between the cathode 2530 and the anode 2540. Gate 2505 is immersed in the electrolyte. A non-uniform morphological feature 2560 is illustrated.

FIG. 25B schematically illustrates the gate electrode resistance $R_{gate}$ and the resistance of a non-uniform morphological feature $R_{numf}$. In order to efficiently strip non-uniform morphological features the resistance of the gate electrode preferably should be lower than that of the non-uniform morphological feature. Power is given by $I^2R$, or by $V^2/R$, where I is current, V is voltage and R is resistance. A common stripping current will be caused to flow through the gate electrode and the non-uniform morphological feature. If $R_{numf}$ is larger than $R_{gate}$ the power necessary to strip the non-uniform morphological feature is dissipated in the non-uniform morphological feature, and much less power is dissipated in the gate itself. In a preferred embodiment, $R_{gate}$ is less than 1 kOhm resistance.

Figure 26:
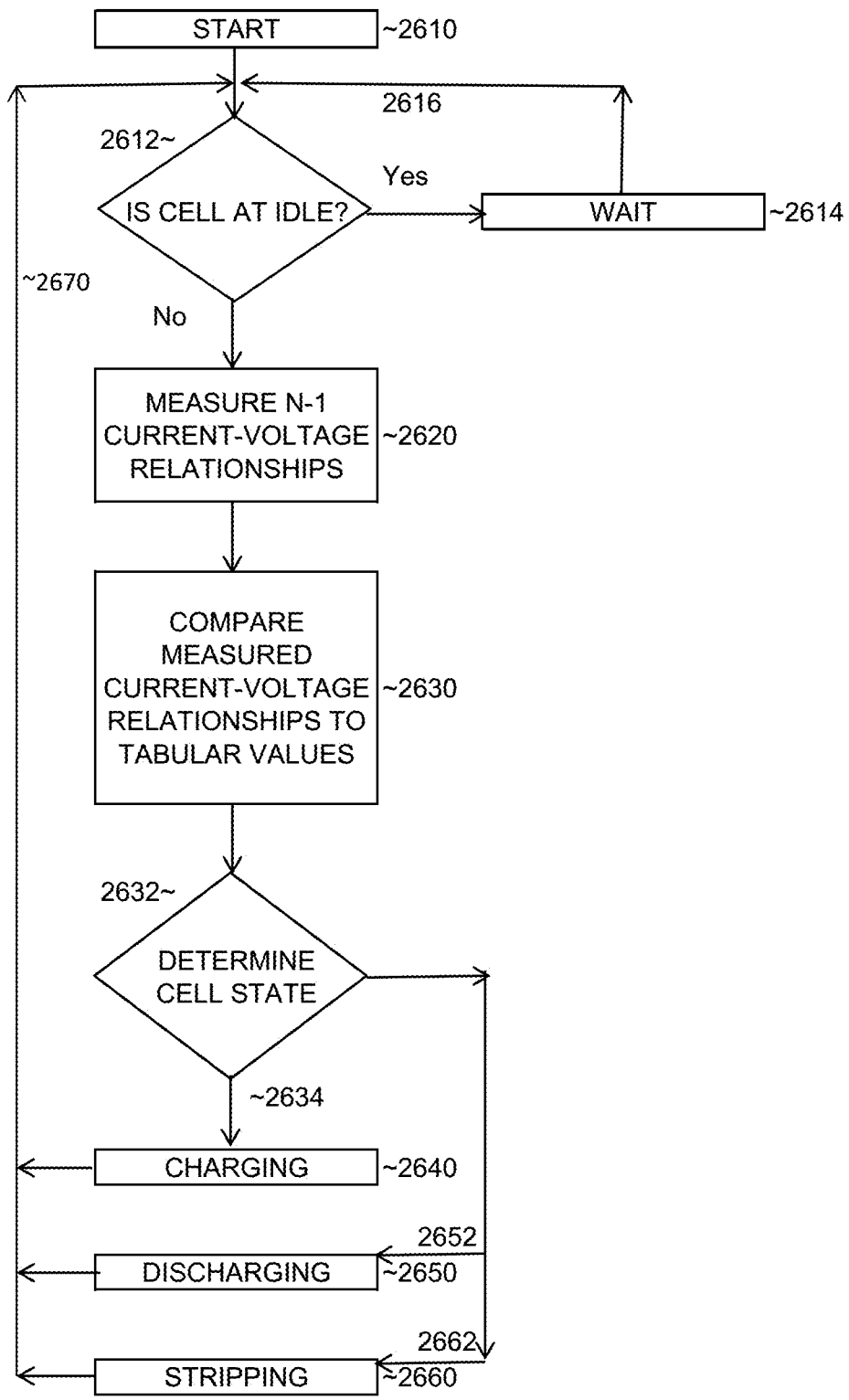
FIG. 26 is a flow chart illustrating the operating method for a cell protected according to the present disclosure.

FIG. 26 is a flow chart illustrating the operating method for a multi-electrode electrochemical (MEE) cell protected according to the present disclosure. In general, if there are N electrodes in the multi-electrode electrochemical cell, where N is an integer greater than or equal to 3, N−1 control circuits can be employed to actively control the current and voltage relationships among the N electrodes. The process starts at step 2610. In step 2612, the active control circuit checks to see if the cell is or is not at idle (e.g., is disconnected from an operating apparatus that uses the cell as a current or voltage source or sink, and exhibits appropriate electrical parameters that are not varying with time). If the cell is at idle, the process performs a wait cycle 2614 and goes back to step 2612. If the controller determines that the cell is not at idle (i.e., that the cell is operating, or that the cell electrical parameters are changing with time), the process proceeds to step 2620, and the active control circuit measures the N−1 current/voltage relationships that exist among the N electrodes.

In step 2630, the N−1 measured current/voltage relationships are compared to entries in a table (or are compared to hard wired current or voltage references, or some combination of such comparisons is performed).

In step 2632, the active control circuit determines the cell state, which can be any one of normal operation with charging (represented by box 2640), normal operation with discharging (represented by box 2650), and a state in which stripping of non-uniform morphological features is appropriate (represented by box 2660).

In box 2640, the controller causes the MEE cell to be charged by passing a current between the anode and the cathode, or alternatively, by applying a voltage between the anode and the cathode.

In box 2650, the controller permits the MEE cell to be discharged by controlling (or limiting) a current that flows between the anode and the cathode, or alternatively, by controlling (or limiting) a voltage between the anode and the cathode.

In box 2660, the controller applies a current or a voltage between a gate electrode and one of the anode and the cathode in order to cause a non-uniform morphological feature to be "stripped" or dissolved.

Each of the processes represented by boxes 2640, 2650 and 2660 can be maintained for a predetermined interval, which can be dependent on the state of the MEE cell, or can be a default interval of time sufficient to cause a predefined amount of charge to pass a terminal of a specific electrode (e.g., a pulse duration or a number of cycles of a periodic function).

From time to time, the control circuit returns via path 2670 to step 2612, and the then current state of the multi-electrode electrochemical cell is again evaluated. The process can be iterated as many times as desired or as may be useful to maintain the MEE cell in a desired state.

The method embodied in FIG. 26 may be implemented manually, or by other well known methods such as the use of a controller described below.

Figure 29A:
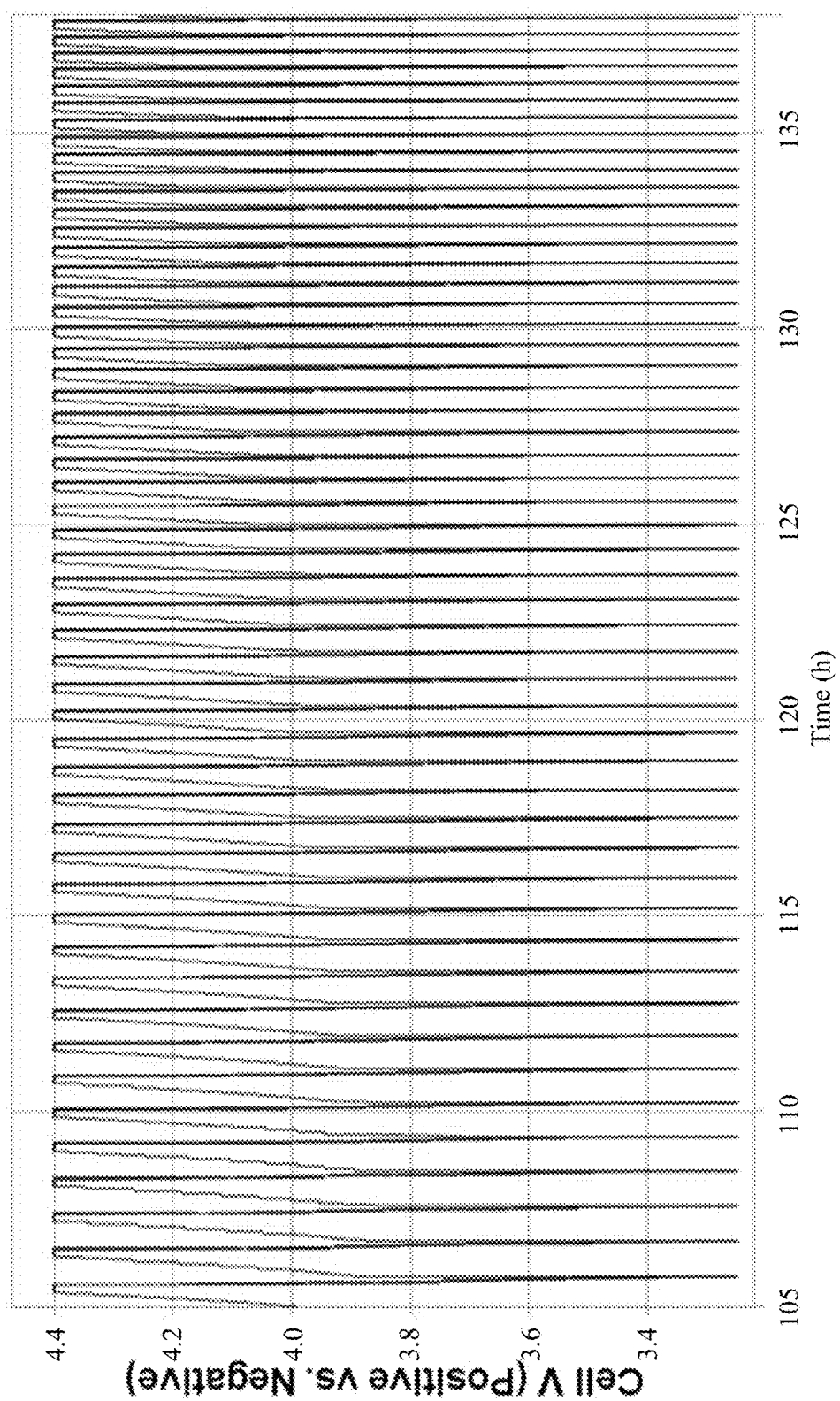
FIG. 29A is a graph of the cell voltage (i.e., the voltage measured between the positive and negative cell terminals) as a function of time for a rechargeable Li metal secondary cell wherein the N/P capacity ratio ≤1.

FIG. 29A is a graph of the cell voltage (i.e., the voltage measured between the positive and negative cell terminals) as a function of time for a rechargeable Li metal secondary cell wherein the N/P capacity ratio ≤1.

Figure 29B:
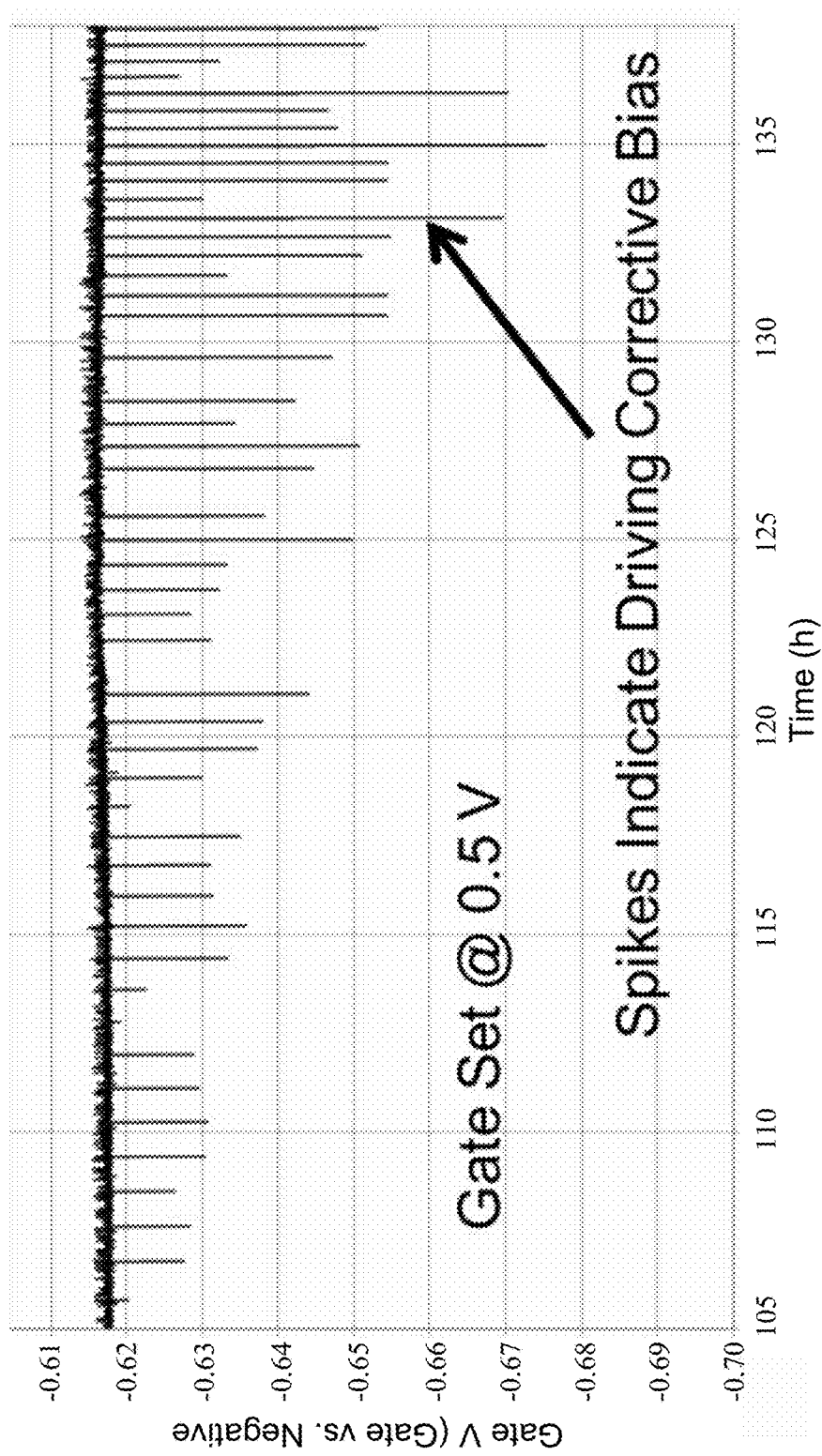
FIG. 29B is a graph that depicts the gate voltage (i.e., the voltage measured between the gate and negative cell terminal in this case) as a function of time for a rechargeable Li metal secondary cell wherein the N/P capacity ratio ≤1.

FIG. 29B is a graph that depicts the gate voltage (i.e., the voltage measured between the gate and negative cell terminals) as a function of time for a rechargeable Li metal secondary cell wherein the N/P capacity ratio ≤1. Note the gated cell depicted here is under active control wherein the bias is set at about 0.5 V.

Deviation of the gate voltage from the nominal value is represented as the voltage "spikes." This deviation corresponds to an increase in anode potential at the end of discharge due to depletion of Li from the negative electrode. The control circuit recognizes the response of the gate potential and responds by driving oxidative current necessary to correct the gate potential vs. the negative electrode, so as to maintain the desired operating conditions and corresponding state of health.

Figure 30:
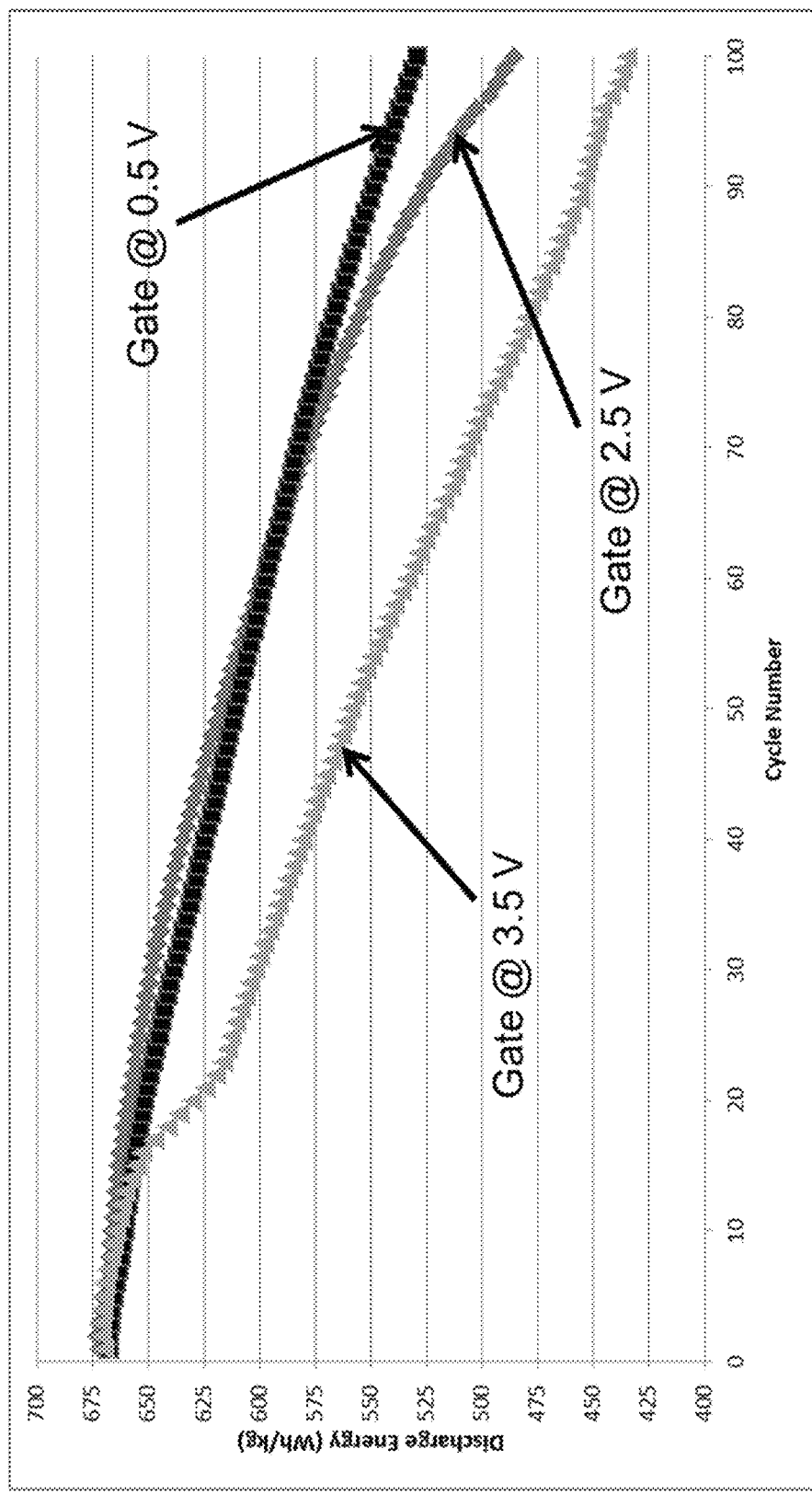
FIG. 30 depicts the cathode energy density as a function of cycle number for gated rechargeable Li metal secondary cell wherein the N/P capacity ratio ≤1.

In another non-limiting example of active control embodiment FIG. 30 depicts the cathode energy density as a function of cycle number for gated rechargeable Li metal secondary cell wherein the N/P capacity ratio ≤1. Note the gated cells depicted here are under active control wherein the gate bias is set at either 0.5 V, 2.5 V, or 3.5 V. The gate potential is controlled vs. the negative electrode in this example, so that the gate electrode may impose oxidative or reductive current in order to maintain the desired gate potential set point. This data indicates that key performance criteria of the cell such as energy density and capacity fade are directly influenced by the method of active control of the gate.

Figure 31:
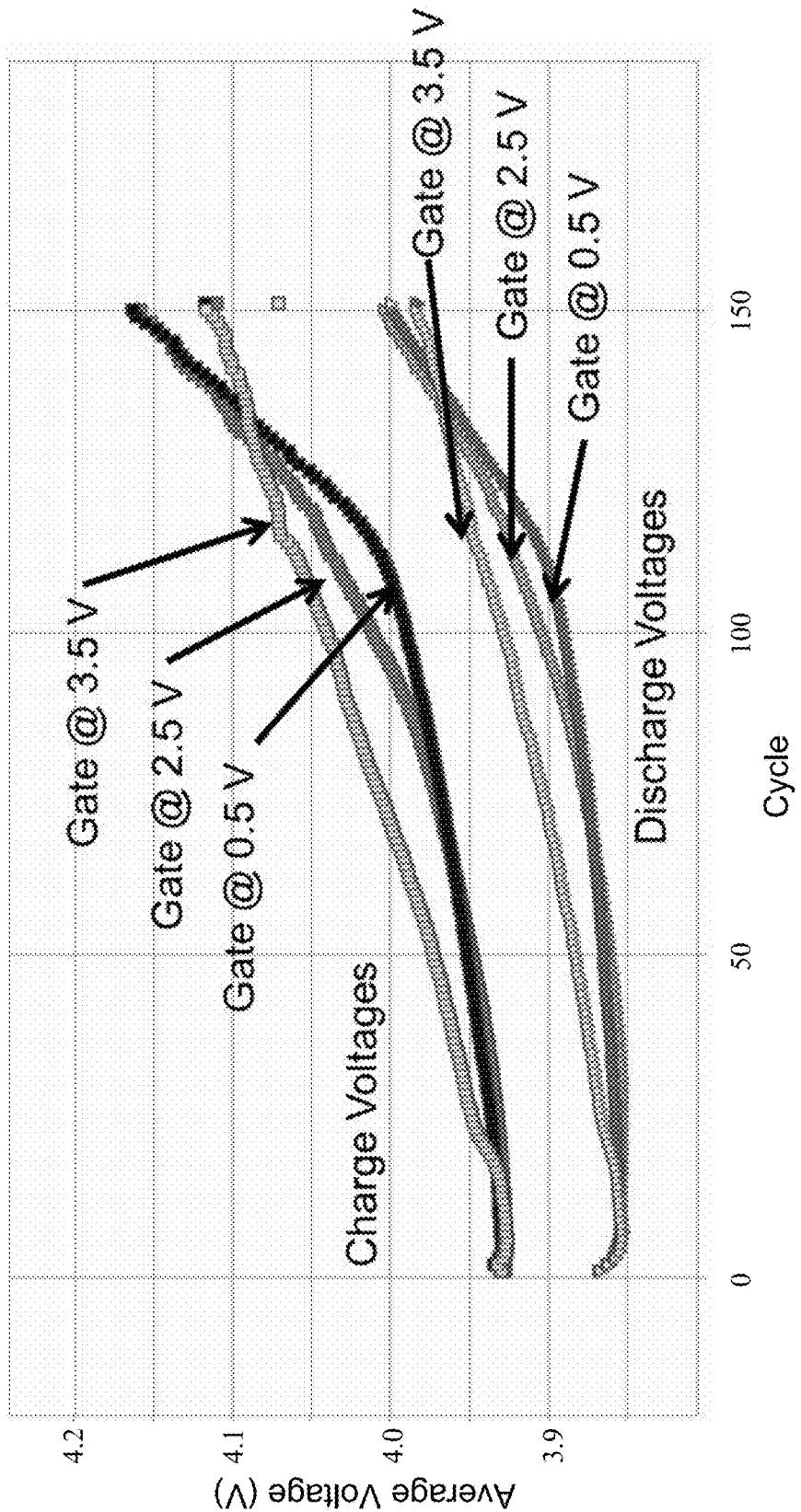
FIG. 31 depicts the average charge and discharge voltage as a function of cycle number for gated rechargeable Li metal secondary cell wherein the N/P capacity ratio ≤1.

FIG. 31 depicts the average charge and discharge voltage as a function of cycle number for the gated rechargeable Li metal secondary cell wherein the N/P capacity ratio ≤1 depicted in FIG. 30. Note the gated cells depicted here are under active control wherein the bias is set at either 0.5 V, 2.5 V, or 3.5 V. The data depicted in FIG. 31 indicates that the active control of the gate potential directly influences the average charge and discharge potential of the cells. Consequently for the cell chemistry and design depicted in FIG. 30 and FIG. 31, applying active control set point of the gate to 0.5 V vs. the negative electrode maintains favorable average cell potential for more cycles than when setting the gate potential to 2.5 V or 3.5 V.

Figure 32:
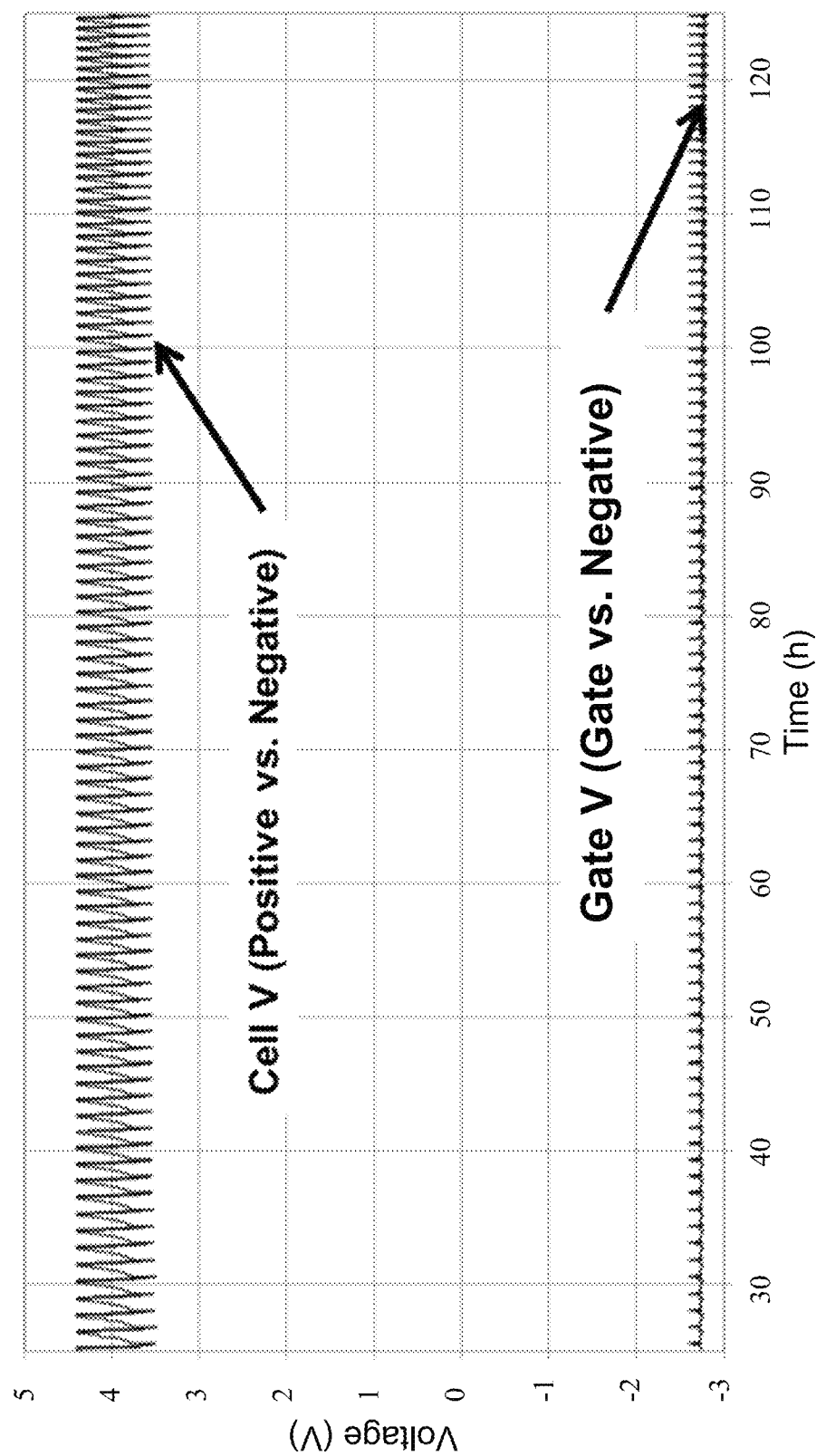
FIG. 32 depicts a segment of the cell voltage and gate voltage as a function of cycle number for gated rechargeable Li metal secondary cell wherein the N/P capacity ratio ≤1 under active control.

In yet another embodiment of active control FIG. 32 depicts the charge and discharge voltage as a function of cycle number for gated rechargeable Li metal secondary cell wherein the N/P capacity ratio ≤1. Note the gated cells depicted herein are under active control wherein the gate potential changing to −2.6 V vs. the negative electrode signifies optimal depletion of the active material from the negative electrode. Upon recognition of this event the control circuit responds, triggering end of cell discharge. The cell then proceeds to the next step in the operation sequence; in this case initiate charge. The gate potential is controlled vs. the negative electrode in this example.

Figure 33:
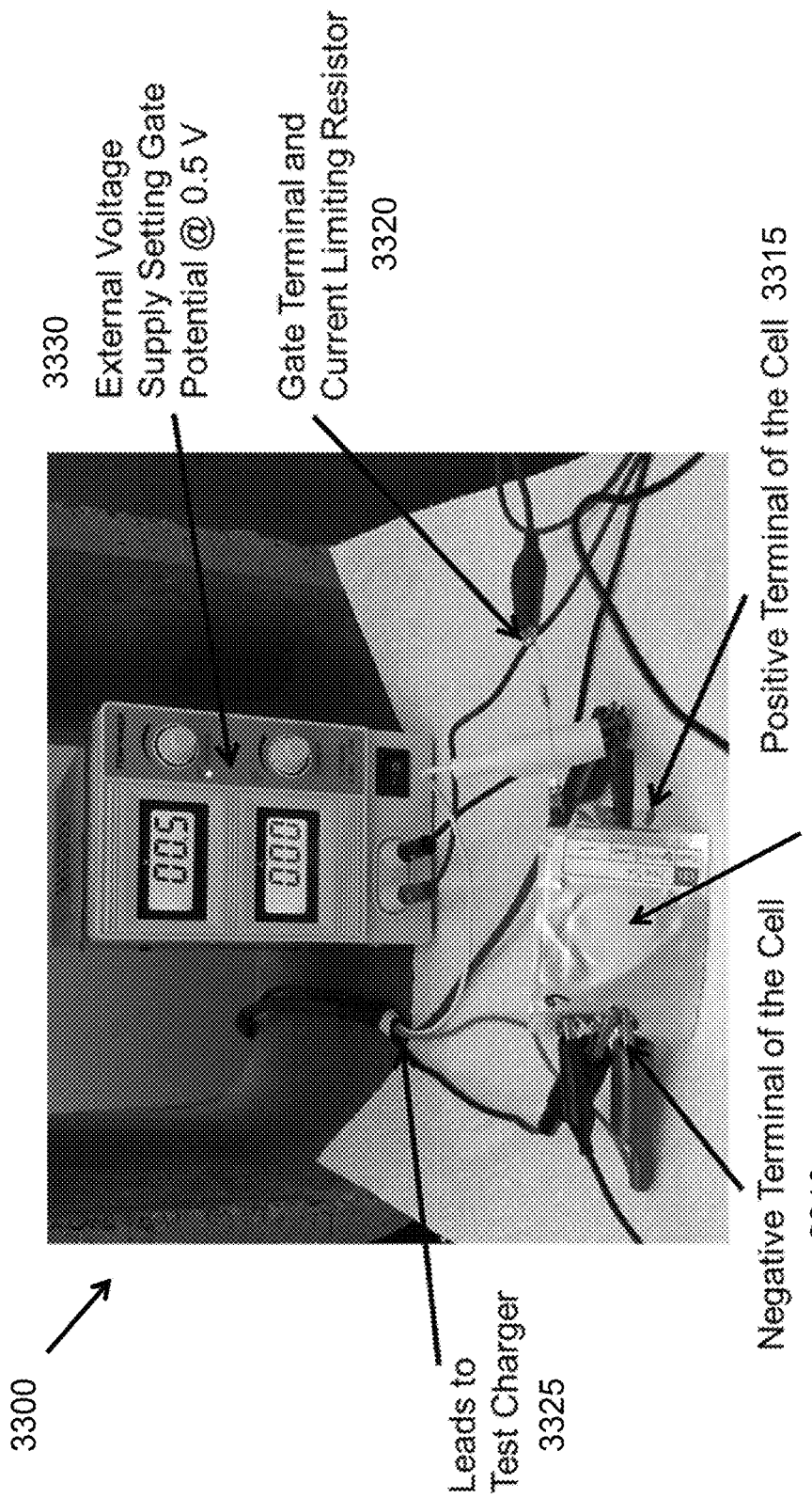
FIG. 33 is an image of a test apparatus for operating a cell according to the present disclosure, which incorporates a gate electrode.

FIG. 33 is an image of a test apparatus 3300 for operating a cell according to the present disclosure, which incorporates a gate electrode. As seen in FIG. 33, a Cell 3305 has a negative electrode with a negative terminal 3310, a positive electrode with a positive terminal 3315, a gate terminal 3320 which is connected to a limiting resistor, and which is in electrical communication with test apparatus comprising a test charger 3325 and an external voltage supply 3330 that is used to set a voltage of the gate electrode relative to one of the negative electrode and the positive electrode. Note that the gate itself comprises about 100 nm of gold-palladium alloy sputtered onto porous polyolefin separator connected to a tab via ultrasonic weld.

Method of Periodic Dendrite Dissolution

Figure 27:
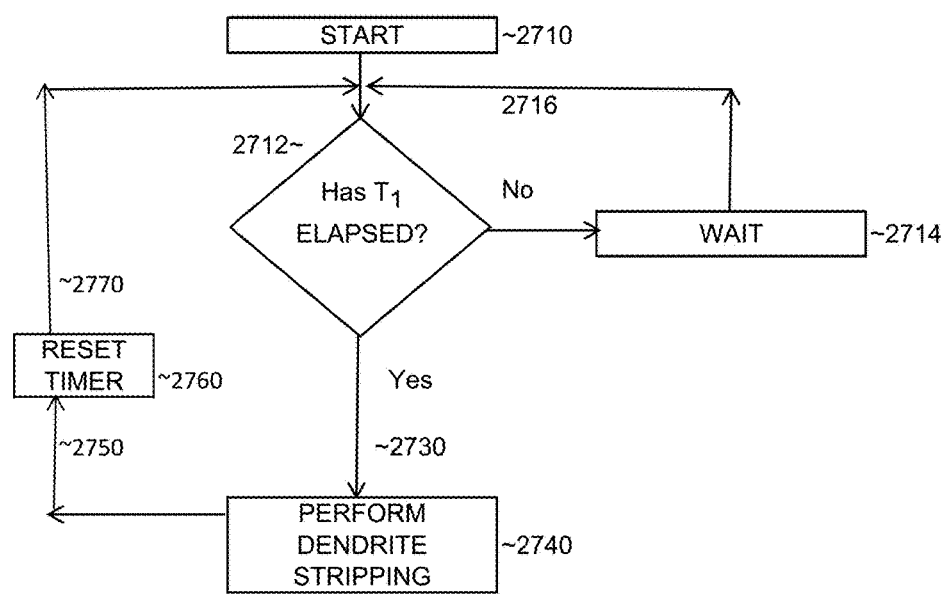
FIG. 27 is a flow chart illustrating an alternative operating method for a cell protected according to the present disclosure.

FIG. 27 is a flow chart illustrating an alternative operating method for a cell protected according to the present disclosure, using a controller. In the process shown in FIG. 27, the cell is periodically operated in a manner calculated to dissolve dendrites that may have begun to grow from one of the anode electrode or the cathode electrode, and can be applied even before an incipient short circuit is detected. In some embodiments, this method may, for example be applied to a battery during a period when it is expected that the battery will not be required to be used in a specific application, such as a time when a machine is scheduled to be out of operation (e.g., an automobile sitting parked in a garage in a home overnight, an aircraft parked at an airport overnight, or the like).

The process starts at step 2710. When the cell is first turned on in a charge mode, a timer is activated in the controller, and the cumulative duration of charge is measured. The controller records the cumulative duration of charge from the first turn on along with the current required to maintain the gate at target potential.

For a given model of secondary battery, one can build a database over time that includes the charge interval needed to reach a critical cell-health condition in individual secondary batteries of that model are recorded. Over time, one can determine with a numerical confidence level a charge time $T_1$ after which a shorting event is likely to occur.

For example, one might determine that a charge duration of $T_0$ hours will result in the presence of a short across the secondary battery with a confidence of 95%. One could then set a duration $T_1=0.9 \times T_0$ as a duration at which a discharge step or a stripping step might reasonably be instituted so as to avoid the likelihood that a short condition might occur. In principle, a shorter duration can be set if the consequence of a short occurring would be more serious, and a longer duration can be set if the consequence of a short occurring would be less serious.

In step 2712 the control compares the cumulative duration of charge from the first turn on against a recorded value of $T_0$ and determines if duration $T_1$ has elapsed. If the duration $T_1$ has not elapsed, the controller passes control to step 2714. If duration $T_1$ has elapsed, the controller passes control to via arrow 2730 to step 2740.

In step 2714 the controller waits and checks again after a waiting period, which waiting period preferably is a short interval compared to the value of $T_1$. The process then moves along arrow 2716 back to step 2712.

In step 2740 the controller institutes a stripping or discharge step, after making sure that taking the monitored secondary battery out of operation will not present a problem. The stripping or discharge step can be operated for a duration calculated to dissolve dendrites.

Upon completion of step 2740 the controller moves the process to step 2760 by way of arrow 2750.

In step 2760 the controller resets recorded value of $T_0$ to zero.

Upon completion of step 2760 the controller moves the process to step 2712 by way of arrow 2770.

The process can then repeat for that secondary battery. The process can be performed for each secondary battery in an array, so that no secondary battery runs a reasonable chance of reaching a shorted state. Since the process is statistical, no measurement of the state of the secondary battery as regards a shorting condition needs to be performed.

The same principles for managing cells can be extended to batteries composed from one or more cells.

Description of the Controller

U.S. Pat. No. 6,002,239 describes several embodiments of circuits that can control the voltage applied between a cathode and an anode of a rechargeable battery. U.S. Pat. No. 6,002,239 does not describe a battery having a gate electrode in addition to the cathode and the anode. U.S. Pat. No. 6,002,239 does not describe a circuit that controls the respective relative voltage between a cathode and a gate electrode or the relative voltage between an anode and a gate electrode in a battery having a gate electrode in addition to the cathode and the anode.

In the present application one needs a circuit that controls the current-voltage relationship among each pair of electrodes, e.g. between the anode and the gate electrode, between the cathode and the gate electrode, and between the cathode and the anode. In some embodiments, setting two of the three current-voltage relationships is sufficient, because the third relationship will then be determined.

Figure 28:
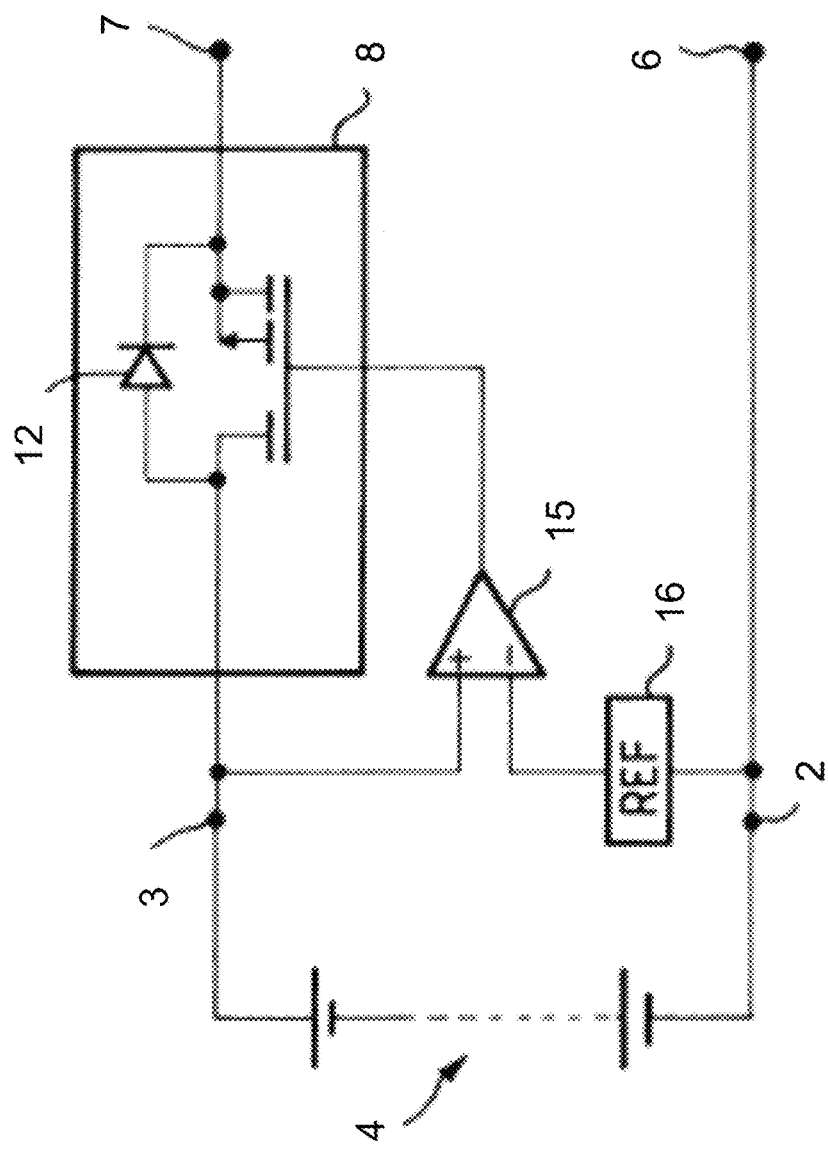
FIG. 28 is a schematic of a prior art control circuit that can be used to operate a multi-electrode electrochemical cell according to the present disclosure.

FIG. 28 is a schematic of one prior art control circuit (presented in U.S. Pat. No. 6,002,239 as FIG. 2 thereof and described in detail therein) that can be used to operate a multi-electrode electrochemical cell according to the present disclosure. In some embodiments, two control circuits as illustrated in FIG. 28 can be used by connecting terminal 2 of each circuit to a single electrode selected from the anode, the cathode and the gate electrode of a multi-electrode electrochemical cell, connecting terminal 3 of one control circuit to another of the anode, the cathode and the gate electrode of the multi-electrode electrochemical cell, and connecting terminal 3 of the other control circuit to the remaining one of the anode, the cathode and the gate electrode of the multi-electrode electrochemical cell. In the circumstance that additional (i.e., more than two) gate electrodes are provided within the multi-electrode electrochemical cell, each such additional gate electrode can be independently controlled by an additional control circuit such as shown in FIG. 28. In other embodiments, control circuits as shown in FIG. 1 and FIG. 3 of U.S. Pat. No. 6,002,239 can also be employed.

While FIG. 28 shows an embodiment that relies on a hard-wired implementation, one can modify a circuit such as shown in FIG. 28 to allow manual operation by an operator, which may require a display or annunciator to provide the operator with information that represents some or all of the measured current-voltage relationships determined in step 2620. In another alternative embodiment, the controller can comprise a general purpose programmable computer that operates under the control of instructions recorded on a machine-readable medium.

Definitions

As used in the present application, the term "cell health" is to be understood as a descriptor of the physical condition of a cell, such as "normal cell health" to describe a cell having normal operating parameters.

As used in the present application, the term "cell health event" is to be understood as denoting a condition in which a cell of the invention deviates from one having "normal cell health." Examples include a cell exhibiting a higher than normal current required to maintain a gate electrode at a predetermined potential, a cell exhibiting a voltage between a gate electrode and either of an anode electrode or a cathode electrode that is lower than a threshold voltage, or a cell exhibiting a resistance between a gate electrode and either of an anode electrode or a cathode electrode that is lower than a threshold value.

As used in the present application, the term "non-uniform morphology," whether used in the singular or plural form, is to be understood as referring to any of an asperity, a dendrite, a whisker, a roughness of a surface, an unevenness of a surface, an object that forms a projection, a warping of a surface, a swelling from a surface, or the like. These recited examples are not meant to be exclusive, but to convey the understanding that the term "non-uniform morphology" relates to many different types of irregularities of shape of an electrode surface that can come to pass as a battery is operated, or as a battery ages.

As used in the present application, the term "active electrode" is to be understood as an electrode that can in normal operation after manufacturing be operated by an external device, such as a power supply or a controller, so that the electrode is obliged to assume a current and/or voltage condition that is imposed upon it by the power supply and/or the controller. In contradistinction, the term "passive electrode" is to be understood as an electrode that assumes a current and/or voltage condition as a consequence of the normal operation after manufacturing of an electrochemical cell as a function of time, and which current and/or voltage condition is not imposed upon it by a power supply and/or a controller. It is further to be understood that while a specific electrode may at some times be considered an "active electrode" and at other times a "passive electrode", any electrode that is described or is understood to be an "active electrode" at any time in normal operation after manufacturing is categorized as an "active electrode." That is to say that an "active electrode" may not be controlled at all times, but a "passive electrode" is never controlled in normal operation after manufacturing.

As used in the present application, the term "Mg cell" or "Mg battery" is to be understood as referring to an electrochemical cell in which the redox-active species in an electrolyte comprises magnesium (Mg) in whatever form, such as a metal, an ion, a salt, a chelate, and a compound.

Unless otherwise explicitly recited herein, any reference to an electronic signal or an electromagnetic signal (or their equivalents) is to be understood as referring to a non-volatile electronic signal or a non-volatile electromagnetic signal.

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use, so that the result can be displayed, recorded to a non-volatile memory, or used in further data processing or analysis.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A device comprising:
   a cathode electrode having a cathode electrical terminal, said cathode electrode in electrochemical communication with an electrolyte;
   an anode electrode having a anode electrical terminal, said anode electrode in electrochemical communication with said electrolyte;
   at least one gate electrode having a gate electrode electrical terminal, said at least one gate electrode in electrochemical communication with said electrolyte and permeable to at least one mobile species which is redox-active at at least one of said anode electrode or said cathode electrode, said at least one gate electrode situated between said cathode electrode and said anode electrode, said at least one gate electrode configured to provide a metal free zone during device operation; and
   a control circuit configured to actively control an operating parameter of the device, said control circuit in electrical communication with each of said cathode electrode, said anode electrode, and said at least one gate electrode at the same time.

2. The device of claim 1, wherein said control circuit is configured to set a voltage of said at least one gate electrode at a voltage difference from a voltage of at least one of said anode electrode or said cathode electrode.

3. The device of claim 2, wherein said voltage difference is sufficient to strip plated metal derived from said at least one mobile species.

4. The device of claim 2, wherein said voltage difference is a formation potential of a non-uniform morphological feature.

5. The device of claim 1, wherein said control circuit is configured to maintain a current between said at least one gate electrode and said anode electrode to be less than a threshold current.

6. The device of claim 1, wherein said control circuit is configured to control a flow of current through said device based on one of a voltage, an impedance and a current measured between said at least one gate electrode and at least one of said anode electrode or said cathode electrode.

7. The device of claim 1, wherein said device is a secondary electrochemical cell.

8. The device of claim 1, wherein said at least one gate electrode has a planar geometry defined by a thickness dimension and a two dimensional area perpendicular to said thickness dimension.

9. The device of claim 8, wherein said at least one gate electrode is ionically conductive along said thickness dimension and is electrically conductive perpendicular to said thickness dimension.

10. The device of claim 1, wherein an impedance measured at a frequency less than 1 Hertz between any two points on a two dimensional area perpendicular to a thickness dimension of said at least one gate electrode is less than 1 MegaOhm.

11. The device of claim 1 wherein said anode electrode is a metal anode.

12. The device of claim 11 wherein said metal anode is magnesium or an alloy containing magnesium.

13. The device of claim 11 wherein said metal anode comprises a metal or an alloy containing a metal selected from the group of metals consisting of zinc, calcium, aluminum, lithium, sodium, and lead.

14. The device of claim 1 wherein said anode electrode is an anode electrode selected from the group consisting of a conversion anode, an intercalation host, an alloying reaction anode and a disproportionation reaction anode.

15. The device of claim 1 wherein a redox-active ionic species is lithium and said anode electrode comprises a material selected from the group of materials consisting of crystalline carbon, amorphous carbon, Na, K, Rb, Cs, Be, Mg, Ca, Sr, Al, Si, Ge, Sb, Pb, In, Zn, Sn, and binary Me-X compounds wherein X is selected from the group consisting of sulfur, phosphorous, nitrogen and oxygen, and Me includes a metal selected from the group consisting of Mg, Ca, Sr, Ti, Zr, V, Nb, Ta, Cr, Mo, W, Mn, Fe, Co, Ni, Cu, Ag, Zn, Cd, B, Al, Si, Sn, Ge, Sb, Bi and a combination thereof.

16. The device of claim 1, wherein said anode electrode is configured to operate using as a measured value a temperature, a voltage, a charging-rate or a combination thereof.

17. The device of claim 1, wherein said at least one gate electrode comprises one of an electronically conducting material as freestanding form or an electronically conductive film deposited upon an insulating substrate having porosity and tortuosity, and connected to external circuit through a dedicated tab.

18. The device of claim 1 wherein said at least one gate electrode has porosity sufficient to maximize the efficiency of a permeability to said at least one mobile species.

19. The device of claim 1 wherein said at least one gate electrode has porosity having sufficient tortuosity that a non-uniform morphological feature projecting through said at least one gate electrode makes electrical contact to said at least one gate electrode.

20. A secondary electrochemical cell having a cathode electrode having a cathode electrical terminal, said cathode electrode in electrochemical communication with a electrolyte and an anode electrode having a anode electrical terminal, said anode electrode in electrochemical communication with said electrolyte;
   wherein the improvement comprises:
      at least one gate electrode having a gate electrode electrical terminal, said at least one gate electrode in electrochemical communication with said electrolyte and permeable to at least one mobile species in said electrolyte which is redox-active at at least one of said anode electrode or said cathode electrode, said at least one gate electrode situated between said cathode electrode and said anode electrode, said at least one gate electrode configured to provide a metal free zone during device operation; and
      a control circuit configured to actively control an operating parameter of the device, said control circuit in electrical communication with each of said cathode electrode, said anode electrode, and said at least one gate electrode at the same time.

21. A method of making an electrochemical device, comprising the steps of:
   providing a cathode electrode having a cathode electrical terminal;
   providing an anode electrode having a anode electrical terminal;
   providing an electrolyte in in electrochemical communication with said cathode electrode and said anode electrode;
   providing at least one gate electrode having a gate electrode electrical terminal, said at least one gate electrode in electrochemical communication with said electrolyte and permeable to at least one mobile species in said anode electrode which is redox-active at at least one of said anode electrode or said cathode electrode, said at least one gate electrode situated between said cathode electrode and said anode electrode, said at least one gate electrode configured to provide a metal free zone during device operation; and
   providing a control circuit configured to actively control an operating parameter of the device, said control circuit in electrical communication with each of said cathode electrode, said anode electrode, and said at least one gate electrode at the same time.

22. A method of operating an electrochemical device, comprising the steps of:
   providing a cathode electrode having a cathode electrical terminal;
   providing an anode electrode having a anode electrical terminal;
   providing an electrolyte in in electrochemical communication with said cathode electrode and said anode electrode;
   providing at least one gate electrode having a gate electrode electrical terminal, said at least one gate electrode in electrochemical communication with said electrolyte and permeable to at least one mobile species in said anode electrode which is redox-active at at least one of said anode electrode or said cathode electrode, said at least one gate electrode situated between said cathode electrode and said anode electrode, said at least one gate electrode configured to provide a metal free zone during device operation;
   providing a control circuit configured to actively control an operating parameter of the device, said control circuit in electrical communication with each of said cathode electrode, said anode electrode, and said at least one gate electrode at the same time; and
   operating said electrochemical device such that said control circuit maintains said operating parameter of said electrochemical device in a condition of normal cell health.

* * * * *